(12) United States Patent
Yoshida et al.

(10) Patent No.: US 10,302,670 B2
(45) Date of Patent: May 28, 2019

(54) ACCELERATION SENSOR

(71) Applicant: DENSO CORPORATION, Kariya, Aichi-pref. (JP)

(72) Inventors: Naoki Yoshida, Kariya (JP); Kiyomasa Sugimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 225 days.

(21) Appl. No.: 15/314,600

(22) PCT Filed: Dec. 17, 2015

(86) PCT No.: PCT/JP2015/006298
§ 371 (c)(1),
(2) Date: Nov. 29, 2016

(87) PCT Pub. No.: WO2016/103659
PCT Pub. Date: Jun. 30, 2016

(65) Prior Publication Data
US 2017/0192033 A1    Jul. 6, 2017

(30) Foreign Application Priority Data

Dec. 26, 2014  (JP) .................. 2014-264577

(51) Int. Cl.
| | |
|---|---|
| *G01P 15/125* | (2006.01) |
| *G01P 15/18* | (2013.01) |
| *H01G 4/005* | (2006.01) |
| *G01P 15/08* | (2006.01) |
| *H01G 5/18* | (2006.01) |

(52) U.S. Cl.
CPC ........ *G01P 15/125* (2013.01); *G01P 15/0802* (2013.01); *G01P 15/18* (2013.01); *H01G 4/005* (2013.01); *B81B 2201/0235* (2013.01); *H01G 5/18* (2013.01)

(58) Field of Classification Search
None
See application file for complete search history.

(56) References Cited

U.S. PATENT DOCUMENTS

| | | |
|---|---|---|
| 2009/0282914 A1 | 11/2009 | Rehle |
| 2010/0176466 A1* | 7/2010 | Fujii ............... B81B 7/007 257/415 |
| 2016/0187371 A1 | 6/2016 | Sakai et al. |

FOREIGN PATENT DOCUMENTS

| | | |
|---|---|---|
| JP | 2006-184013 A | 7/2006 |
| JP | 2007-139505 A | 6/2007 |

* cited by examiner

*Primary Examiner* — Paul M. West
*Assistant Examiner* — Mark A Shabman
(74) *Attorney, Agent, or Firm* — Posz Law Group, PLC

(57) ABSTRACT

An acceleration sensor includes: a sensor section having a cap section; a sensing section including movable and fixed electrodes and movable and fixed electrode connecting sections; a peripheral section. The cap section includes a movable electrode through-hole electrode in a movable electrode through hole and a fixed electrode through-hole electrode in a fixed electrode through hole. The cap section further includes a movable electrode pad connected to the movable electrode through-hole electrode and a circuit device and a fixed electrode pad connected to the fixed electrode through-hole electrode and the circuit device. The movable electrode pad and the fixed electrode pad are adjacent to each other in a region of the cap section overlapped with the peripheral section in the stacking direction.

20 Claims, 23 Drawing Sheets

ACCELERATION SENSOR

CROSS REFERENCE TO RELATED APPLICATIONS

This application is the U.S. national stage of International Patent Application No. PCT/JP2015/006298 filed on Dec. 17, 2015 and is based on Japanese Patent Application No. 2014-264577 filed on Dec. 26, 2014, the disclosures of which are incorporated herein by reference.

TECHNICAL FIELD

The present disclosure relates to an acceleration sensor for detection of acceleration.

BACKGROUND ART

Conventionally, a Patent Literature 1, e.g., proposes an acceleration sensor using a semiconductor substrate in which a semiconductor layer is laminated on a supporting substrate. That is, in the acceleration sensor, a movable section, having a frame displaced in correspondence with acceleration in a predetermined direction of a surface direction of the semiconductor layer, and provided with movable electrodes, and a fixed section having fixed electrodes opposing the movable electrodes, are formed in the semiconductor layer. The movable section and the fixed section are provided with pads in predetermined positions, and the pads are electrically connected to an external circuit via wires.

PRIOR ART LITERATURES

Patent Literature

Patent Literature 1: JP-2007-139505 A

SUMMARY OF INVENTION

It is an object of the present disclosure to provide an acceleration sensor capable of suppressing decrease in detection accuracy.

According to a first aspect of the present disclosure, an acceleration sensor includes: a sensor section having one surface; a sensing section including a movable electrode displaceable in accordance with acceleration and a fixed electrode arranged to face the movable electrode, and outputting a sensor signal corresponding to a capacitance between the movable electrode and the fixed electrode, the movable electrode and the fixed electrode being arranged on the one surface of the sensor section and providing a comb-teeth structure; and a peripheral section surrounding the sensing section arranged on the one surface of the sensor section. The sensing section further includes a movable electrode connecting section connected to the movable electrode and a fixed electrode connecting section connected to the fixed electrode. The sensor section includes a cap section having one surface and an other surface. The one surface of the cap section is opposed to the one surface of the sensor section. The cap section includes a movable electrode through hole and a fixed electrode through hole, each of which penetrates the cap section in a stacking direction of the cap section and the sensor section to expose the movable electrode connecting section and the fixed electrode connecting section, respectively. The cap section further includes a movable electrode through-hole electrode electrically connected to the movable electrode connecting section and arranged in the movable electrode through hole, and a fixed electrode through-hole electrode electrically connected to the fixed electrode connecting section and arranged in the fixed electrode through hole. The cap section further includes a movable electrode pad arranged on the other surface of the cap section, electrically connected to the movable electrode through-hole electrode via a movable electrode wiring and electrically connected to a circuit device via a circuit wire, and a fixed electrode pad arranged on the other surface of the cap section, electrically connected to the fixed electrode through-hole electrode via a fixed electrode wiring and electrically connected to the circuit device via the circuit wire. The movable electrode pad and the fixed electrode pad are adjacent to each other in a predetermined part of a region of the other surface of the cap section, the region being overlapped with the peripheral section in the stacking direction.

According to the above-described acceleration sensor, viewed from the stacking direction, the mobile electrode pad and the fixed electrode pad are formed adjacently to each other in the predetermined part of the region overlapped with the peripheral section in the other surface of the cap section. Accordingly, it is possible to shorten the wire connecting the mobile electrode pad and the fixed electrode pad with the circuit device by providing the acceleration sensor and the circuit device such that the mobile electrode pad and the fixed electrode pads are on the circuit device side. Accordingly, it is possible to suppress increase in offset voltage due to parasitic capacitance and influence of extraneous noise, and to suppress decrease in detection accuracy.

According to a second aspect of the present disclosure, an acceleration sensor includes: a sensor section having one surface; a sensing section including a movable electrode displaceable in accordance with acceleration and a fixed electrode arranged to face the movable electrode, and outputting a sensor signal corresponding to a capacitance between the movable electrode and the fixed electrode, the movable electrode and the fixed electrode being arranged on the one surface of the sensor section and providing a comb-teeth structure; and a peripheral section surrounding the sensing section arranged on the one surface of the sensor section. The sensing section further includes a movable electrode connecting section connected to the movable electrode and a fixed electrode connecting section connected to the fixed electrode. The sensor section includes a cap section having one surface and an other surface. The one surface of the cap section is opposed to the one surface of the sensor section. The cap section includes a movable electrode through hole and a fixed electrode through hole, each of which penetrates the cap section in a stacking direction of the cap section and the sensor section to expose the movable electrode connecting section and the fixed electrode connecting section, respectively. The cap section further includes a movable electrode through-hole electrode electrically connected to the movable electrode connecting section and arranged in the movable electrode through hole, and a fixed electrode through-hole electrode electrically connected to the fixed electrode connecting section and arranged in the fixed electrode through hole. The cap section further includes a movable electrode pad arranged on the other surface of the cap section, electrically connected to the movable electrode through-hole electrode via a movable electrode wiring and electrically connected to a circuit device via a circuit wire, and a fixed electrode pad arranged on the other surface of the cap section, electrically connected to the fixed electrode through-hole electrode via a fixed electrode wiring and electrically connected to an other circuit device different from the circuit device via the circuit wire. The movable electrode pad is arranged in a predetermined part of a region of the other surface of the cap section, the region being overlapped with the peripheral section in the stacking direction. The fixed electrode pad is arranged in an other predetermined part of the region of the other surface of the cap section, the region being overlapped with the peripheral section in the stacking direction, and the other predetermined part being different from the predetermined part where the movable electrode pad is arranged.

Further, according to the above-described acceleration sensor, viewed from the stacking direction, the mobile electrode pad is formed in the predetermined part of the region overlapped with the peripheral section in the other surface of the cap section, and the fixed electrode pad is formed in the region overlapped with the peripheral section in the other surface of the cap section and different from the region where the mobile electrode pad is formed. Accordingly, it is possible to shorten the wire connecting the mobile electrode pad and the fixed electrode pad with the circuit device by providing the acceleration sensor and the circuit device such that the mobile electrode pad is on the side of a predetermined circuit device and the fixed electrode pad is on the side of another circuit device. Accordingly, it is possible to suppress increase in offset voltage due to parasitic capacitance and influence of extraneous noise, and to suppress decrease in detection accuracy. Further, the mobile electrode pad and the fixed electrode pad are provided away from each other. Note that upon detection of acceleration, e.g., a carrier wave having predetermined amplitude and wavelength is applied to the mobile electrode pad. In this case, the carrier wave becomes a noise source. However, as the mobile electrode pad and the fixed electrode pad are provided away from each other, it is possible to suppress decrease in detection accuracy due to the carrier wave (noise).

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
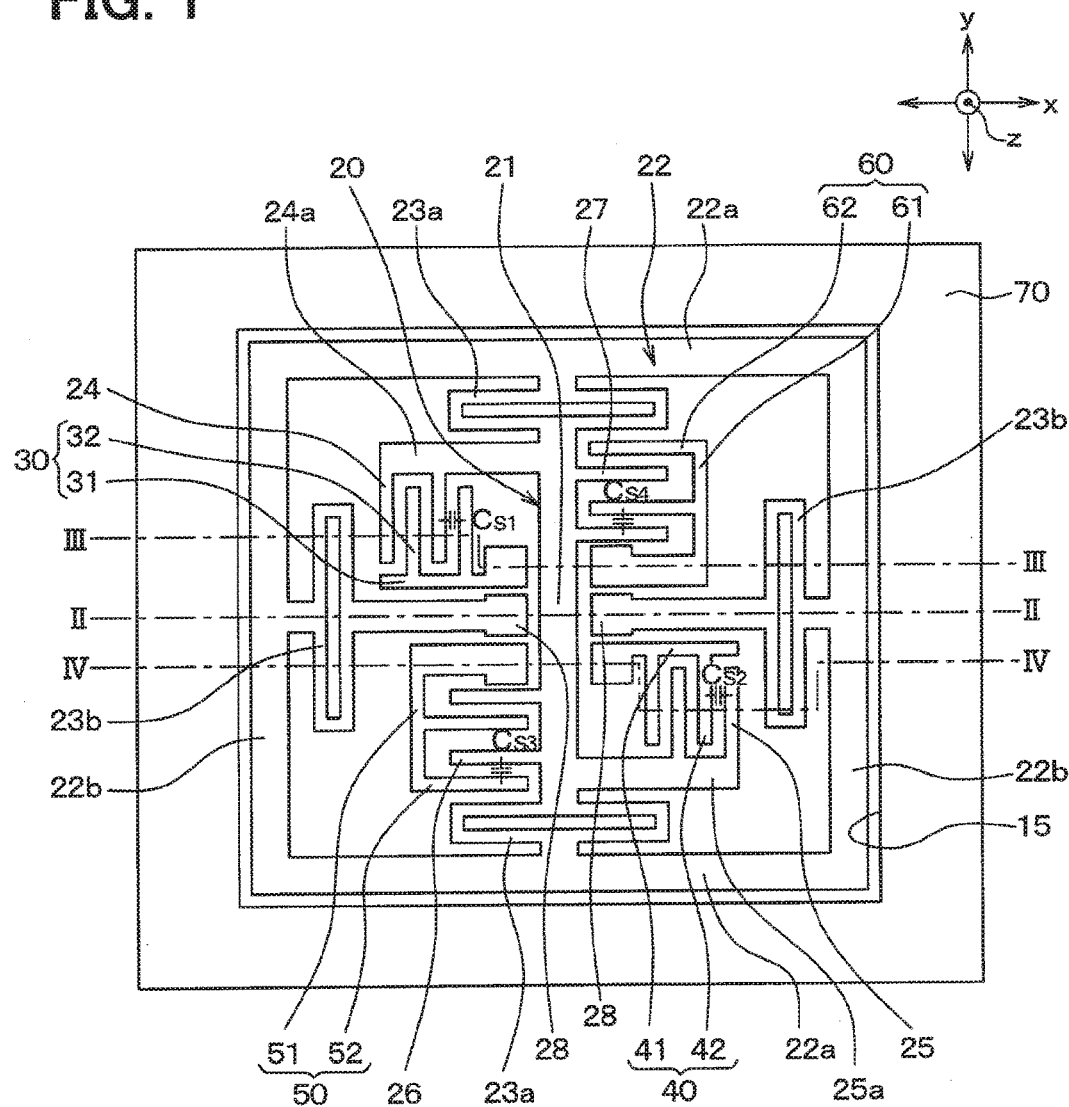
FIG. 1 is a plane view of a sensor section of an acceleration sensor according to a first embodiment according to the present disclosure.

In an acceleration sensor having a movable section and a fixed section, the present applicant proposes an acceleration sensor capable of detecting two orthogonal accelerations in Japanese Patent Application Laid-Open No. 2013-182292.

More particularly, in the acceleration sensor, the movable section has a first direction movable electrode extended along one direction in a surface direction of a semiconductor substrate and a second direction movable electrode extended along a direction orthogonal to the one direction. Further, the fixed section has a first direction fixed electrode provided to oppose the first direction movable electrode and a second direction fixed electrode provided to oppose the second direction movable electrode. Note that the movable section and the fixed section are formed in the semiconductor layer, and supported with the supporting substrate at approximately the center of the sensor section. Then pads are formed in a part supported with the supporting substrate, and the pads are electrically connected to an external circuit via wires. That is, the pads connected to the external circuit are formed approximately at the center of the semiconductor substrate.

However, in this acceleration sensor, when the acceleration sensor and the circuit board are electrically connected via the wires, since the pad are provided approximately at the center of the semiconductor substrate, the length of the wires is often long. Accordingly, the offset voltage is increased due to parasitic capacitance, or the sensor is susceptible to the influence of extraneous noise and the detection accuracy is often lowered.

Note that the acceleration sensor which detects two orthogonal accelerations has been explained as an example. Further, in the case of an acceleration sensor which detects only acceleration in one direction, similar problems may occur.

Hereinbelow, embodiments of the present disclosure will be described based on the drawings. Note that in the description of the following respective embodiments, elements mutually the same or equivalent have the same reference numerals.

First Embodiment

A first embodiment of the present disclosure will be described. Note that the acceleration sensor according to the present embodiment is preferably applicable to detection of, e.g., vehicle acceleration.

As shown in FIGS. 1 to 4, the acceleration sensor according to the present embodiment has a sensor section 10 and a cap section 80. First, the configuration of the sensor section 10 will be described.

In the sensor section 10, a semiconductor layer 13 is laminated on a supporting substrate 11 via an insulating film 12. The sensor section is configured by using an SOT (Silicon on Insulator) substrate 14 which has the semiconductor layer 13 as one surface 10a, and has a rectangular plane shape. Note that in the present embodiment, the SOI substrate 14 corresponds to the semiconductor substrate. Further, as the supporting substrate 11, e.g., a silicon substrate is used. As the insulating film 12, $SiO_2$, SiN or the like is used, and as the semiconductor layer 13, a silicon substrate, polysilicon or the like is used.

In the semiconductor layer 13, a sensing section 16 is formed. The sensing section 16, in which a groove 15 is formed by micromachining, and a movable section 20 and first to fourth fixed sections 30 to 60 are partitioned with the groove 15, outputs a sensor signal corresponding to capacitance. Note that in the semiconductor layer 13, the outside of the part partitioned with the groove 15, i.e., the part partitioned with the sensing section 16 and the groove 15 is a peripheral section 70. That is, the peripheral section 70 is formed so as to surround the sensing section 16 via the groove 15.

In the insulating film 12, a recess 17 from which a part corresponding to the movable section 20 and the first to fourth fixed sections 30 to 60 is removed is formed, and a dent 18 connected to the recess 17 is formed in the supporting substrate 11. With this configuration, in the semiconductor layer 13, a predetermined region of the movable section 20 and the first to fourth fixed sections 30 to 60 is released from the supporting substrate 11. Note that the dent 18 formed in the supporting substrate 11 prevents the parts of the movable section 20 and the first to fourth fixed sections 30 to 60, released from the supporting substrate 11, from contact with the supporting substrate. The dent 18 may be omitted.

Next, respective directions in FIGS. 1 to 4, an x-axis direction, a y-axis direction and a z-axis direction will be described. In FIGS. 1 to 4, the x-axis direction is a horizontal direction in the drawing in FIG. 1; the y-axis direction, a direction orthogonal to the x-axis direction in the surface direction of the 501 substrate 14; and the z-axis direction, a direction orthogonal to the x-axis direction and the y-axis direction. Note that in the present embodiment, the x-axis direction corresponds to the first direction, and the y-axis direction, the second direction.

The movable section 20 has a weight 21 provided to cross over the recess 17, a frame 22 to support the weight 21, first and second beams 23a and 23b provided on the frame 22, and first to fourth movable electrodes 24 to 27.

The weight 21 has a rectangular bar shape in which both ends in the longitudinal direction are supported with the frame 22 via the first beam 23a. More particularly, the weight 21 is supported with the frame 22 such that the longitudinal direction is parallel to the y-axis direction and passes the center of the frame 22.

In the present embodiment, the frame 22 has a rectangular frame shape, and has a pair of first sides 22a extending in the x-axis direction and a pair of second sides 22b extending in the y-axis direction. The frame 22 is formed such that the center corresponds with the center of the supporting substrate 11 (semiconductor layer 13).

The first and second beams 23a and 23b are two parallel beams, having rectangular bar shapes, connected at both ends. The beams have a spring function to be displaced in a direction orthogonal to the longitudinal direction of the two beams. The first beam 23a is provided between the respective first sides 22a of the frame 22 and the respective ends of the weight 21 such that, when acceleration including a component of the y-axis direction is applied, the weight 21 is displaced to the y-axis direction and the initial status is restored in correspondence with disappearance of acceleration. Further, the second beam 23b is provided on the respective second sides 22b of the frame 22 such that when acceleration including a component of the x-axis direction is applied, the frame 22 is displaced to the x-axis direction, and the initial status is restored in correspondence with disappearance of acceleration. In the present embodiment, the second beam 23b is formed line symmetrically with reference to the weight 21, and formed inside the respective second sides 22b of the frame 22.

An anchor 28 supported with the supporting substrate 11 via an insulating film 12 is formed on the opposite side to the second side 22b of the frame 22, with the second beam 23b between the anchor and the second side. The frame 22 is supported with the supporting substrate 11 via the anchor 28. In other words, the frame 22 is supported with the supporting substrate 11 by the anchor 28 formed inside the frame 22. In the present embodiment, the anchor 28 connected to the respective second beam 23b is formed line symmetrically with reference to the weight 21. Further, the respective anchors 28 are parts connected to a movable electrode through-hole electrode 84b to be described later, and correspond to the movable electrode connecting section.

In the present embodiment, two sets of first and second movable electrodes 24 and 25 and third and fourth movable electrodes 26 and 27 are provided on the weight 21 so as to be respectively point symmetrical with respect to the center of the frame 22. More particularly, the weight 21 is provided with first and second supports 24a and 25a projecting from both side surfaces of the weight 21 to mutually opposite directions (x-axis direction) so as to be point symmetrical with respect to the center of the frame 22. The first and second movable electrodes 24 and 25 are provided on the first and second supports 24a and 25a so as to project from the first and second supports 24a and 25a to a line II-II (along the y-axis direction in FIG. 1). Further, the third and fourth movable electrodes 26 and 27 are provided on the weight 21 so as to project from the both side surfaces of the weight 21 to mutually opposite directions (x-axis direction).

That is, in the present embodiment, the first and second movable electrodes 24 and 25 are extended in a direction parallel to the y-axis direction, and the third and fourth movable electrodes 26 and 27 are extended in a direction parallel to the x-axis direction. That is, in the present embodiment, the first and second movable electrodes 24 and 25 correspond to the first direction movable electrode, and the third and fourth movable electrodes 26 and 27 correspond to the second direction movable electrode.

The first to fourth fixed sections 30 to 60 have first to fourth wirings 31 to 61 respectively supported with the insulating film 12, and first to fourth fixed electrodes 32 to 62 supported with the first to fourth wirings 31 to 61 and formed to be engaged with the comb-teeth shape of the first to fourth movable electrodes 24 to 27. With this configuration, the comb-teeth structure is formed with the first to fourth movable electrodes 24 to 27 and the first to fourth fixed electrodes 32 to 62. These first to fourth fixed sections 30 to 60 are formed so as to be point symmetrical with respect to the center of the frame 22 (supporting substrate 11).

Note that in the present embodiment, the first and second fixed electrodes 32 and 42 correspond to the first direction fixed electrodes; the third and fourth fixed electrodes 52 and 62, to the second direction fixed electrodes; the first and second wirings 31 and 41, to the first direction fix-supporting sections; and the third and fourth wirings 51 and 61, to the second direction fix-supporting sections. Further, the first to fourth wirings 31 to 61 become parts in which the respective ends of on the weight 21 side are electrically connected to first to fourth fixed electrode through-hole electrodes 85b to 88b to be described later, and correspond to the fixed electrode connecting sections. That is, in the present embodiment, the movable electrode connecting section and the fixed electrode connecting sections are formed in the sensing section 16, and positioned in approximately central part of the sensor section 10 (SOI substrate 14).

The configuration of the sensor section 10 in the present embodiment, is as described above. Next, the configuration of the cap section 80 will be described.

Figure 2:
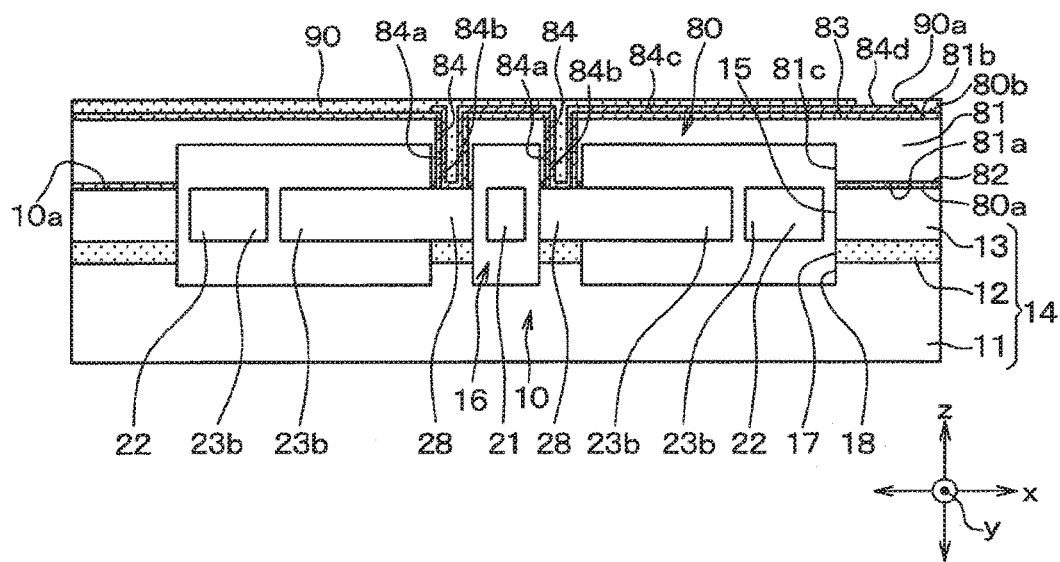
FIG. 2 is a cross sectional view of the acceleration sensor having the sensor section along a line II-II in FIG. 1.
Figure 3:
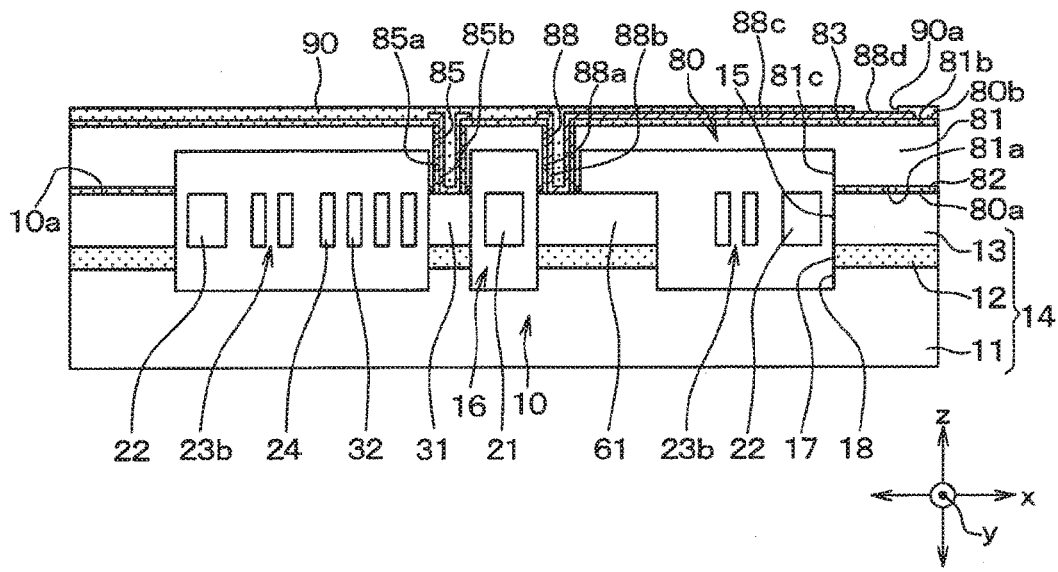
FIG. 3 is a cross sectional view of the acceleration sensor having the sensor section along a line III-III in FIG. 1.
Figure 4:
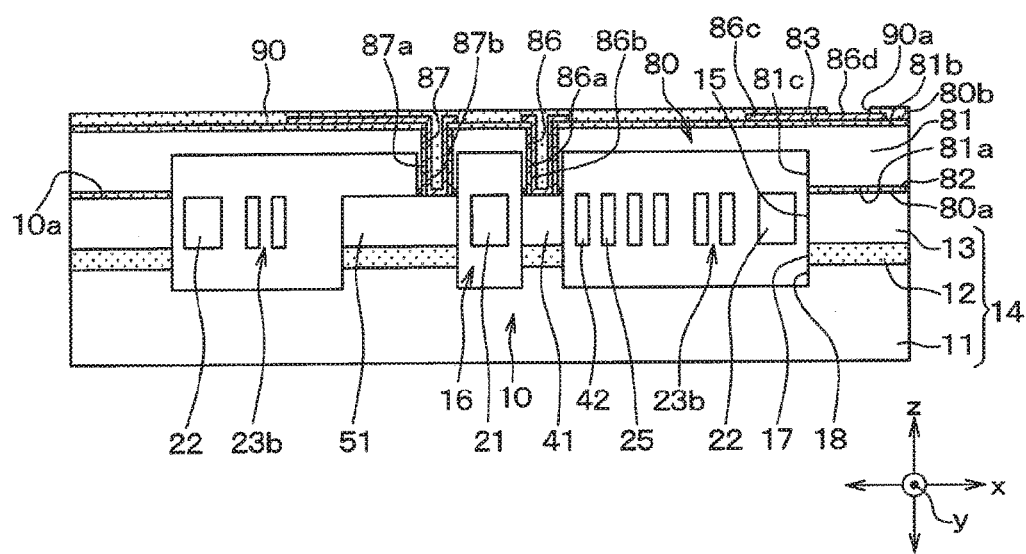
FIG. 4 is a cross sectional view of the acceleration sensor having the sensor section along a line IV-IV in FIG. 1.

As shown in FIGS. 2 to 4, the cap section 80 has one surface 80a and other surface 80b. The one surface 80a is bonded to the one surface 10a of the sensor section 10. More particularly, the cap section 80 has a substrate 81 having one surface 81a and other surface 81b opposite to the one surface 81a, an insulating film 82 formed on the one surface 81a of the substrate 81 on the SOI substrate 14 side, and an insulating film 83 formed on the other surface 81b of the substrate 81. The insulating film 82 formed on the one surface 81a of the substrate 81 forms the one surface 80a of the cap section 80, and the insulating film 82 is bonded to the semiconductor layer 13 (one surface 10a of the sensor section 10) by direct bonding. Note that the other surface 80b of the cap section 80 is formed with the insulating film 83. Further, the cap section 80 has the same plane shape as that of the sensor section 10.

As the substrate 81, a silicon substrate or the like is used. In the one surface 81a, a recess 81c is formed in a part opposing to a part in the movable section 20 and the first to fourth fixed sections 30 to 60 released from the supporting substrate 11. The recess 81c suppresses contact between the part in the movable section 20 and the first to fourth fixed sections 30 to 60, released from the supporting substrate 11, and the cap section 80. Note that in FIGS. 2 to 4, the insulating film 82 is not formed on the wall surface of the recess 81c, however, the insulating film 82 may be formed on the wall surface of the recess 81c.

Further, the cap section 80 has a plurality of through holes 84 to 88 formed through the cap section 80 in a stacking direction of the SOI substrate 14 and the cap section 80. More particularly, as shown in FIG. 2, two movable electrode through holes 84 to expose the respective anchors 28 (movable electrode connecting sections) are formed through the insulating film 83, the substrate 81, and the insulating film 82. Further, as shown in FIGS. 3 and 4, first to fourth fixed electrode through holes 85 to 88 to expose a part of the first to fourth wirings 31 to 61 (first to fourth fixed electrode connecting sections) are formed through the insulating film 83, the substrate 81, and the insulating film 82.

As shown in FIGS. 2 to 4, respective insulating films 84a to 88a are formed on the wall surfaces of the respective movable electrode through hole 84 and the first to fourth fixed electrode through holes 85 to 88. In the respective movable electrode through holes 84, the movable electrode through-hole electrode 84b electrically connected to the anchor 28 is formed via the insulating film 84a. In the first to fourth fixed electrode through holes 85 to 88, the first to fourth fixed electrode through-hole electrodes 85b to 88b electrically connected to the first to fourth wirings 31 to 61 are formed via the insulating films 85a to 88a.

Figure 5:
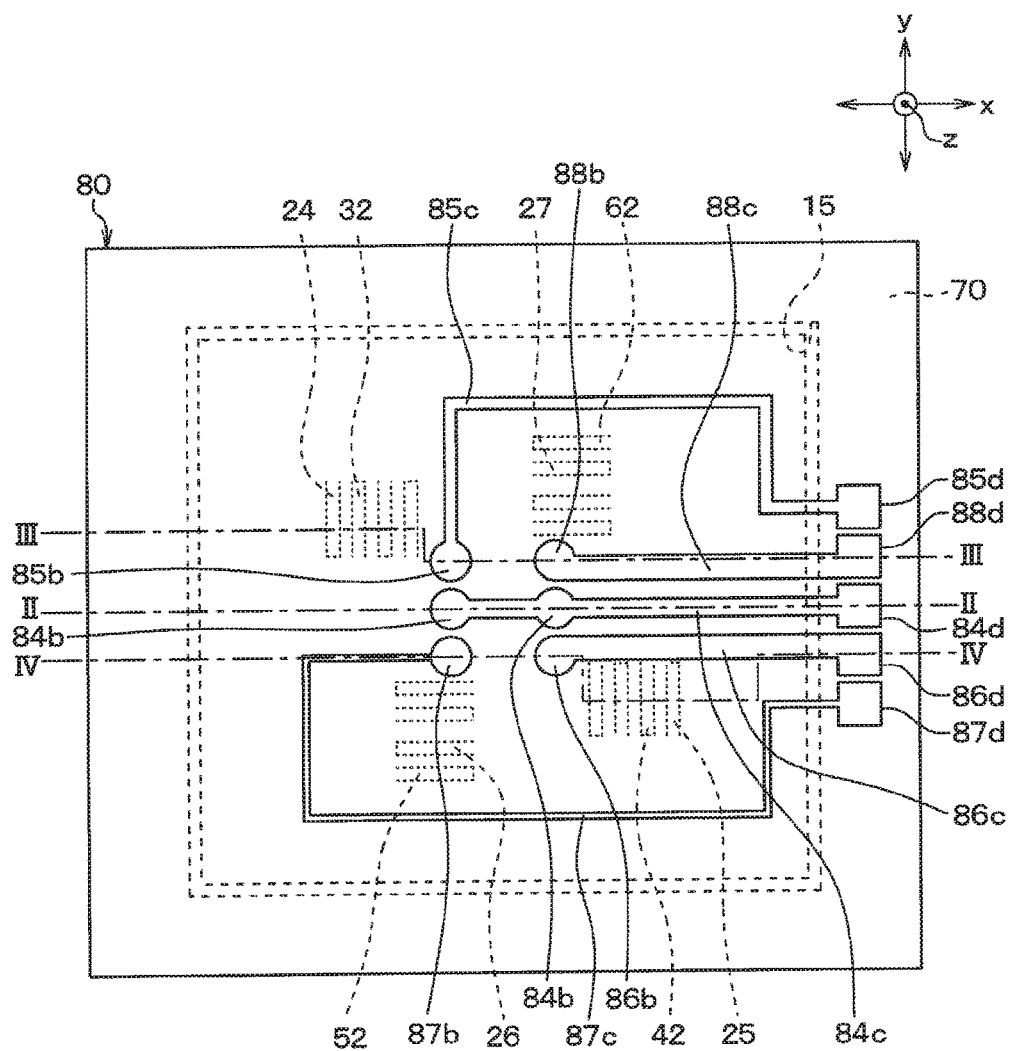
FIG. 5 is a plane schematic diagram of a cap section viewed from a stacking direction of the sensor section and the cap section.

As shown in FIGS. 2 and 5, a movable electrode wiring 84c electrically connected to the movable electrode through-hole electrode 84b, and a movable electrode pad 84d electrically connected to the movable electrode wiring 84c and electrically connected to a circuit board 100 to be described later are formed on the insulating film 83 (the other surface 80b of the cap section 80). Note that the respective movable electrode through-hole electrodes 84b are respectively electrically connected via the movable electrode wiring 84c.

Further, as shown in FIGS. 3 to 5, first to fourth fixed electrode wirings 85c to 88c electrically connected to the first to fourth fixed electrode through-hole electrodes 85b to 88b, and first to fourth fixed electrode pads 85d to 88d electrically connected to the first to fourth fixed electrode wirings 85c to 88c and electrically connected to the circuit board 100 to be described later, are formed on insulating film 83. Further, as shown in FIGS. 2 to 4, a protective film 90 is formed on the insulating film 83. A contact hole 90a to expose a part of the movable electrode wiring 84c and the first to fourth fixed electrode wirings 85c to 88c is formed in the protective film 90. The parts of the movable electrode wiring 84c and the first to fourth fixed electrode wirings 85c to 88c exposed from the contact hole 90a form respective pads 84d to 88d. Note that in the present embodiment, the first and second fixed electrode wirings 85c and 86c correspond to the first direction fixed electrode wirings, and the third and fourth fixed electrode wirings 87c and 88c, to the second direction fixed electrode wirings.

Next, the arrangement relationship among the movable electrode wiring 84c, the movable electrode pad 84d, the first to fourth fixed electrode wirings 85c to 88c, and the first to fourth fixed electrode pads 85d to 88d will be described based on FIG. 5. Note that the cap section 80 in FIGS. 2 to 4 corresponds to a cross section along a line II-II to a line IV-IV in FIG. 5. In FIG. 5, the protective film 90 is omitted.

In the present embodiment, as shown in FIG. 5, viewed from a stacking direction of the sensor section 10 and the cap section 80 (hereinbelow, simply referred to as a "stacking direction"), the movable electrode pad 84d and the first to fourth fixed electrode pads 85d to 88d are formed adjacently to each other in a predetermined part of a region overlapped with the peripheral section 70 of the sensor section 10.

More particularly, the movable electrode pad 84d and the first to fourth fixed electrode pads 85d to 88d are formed adjacently to each other in the vicinity of predetermined one side forming the plane shape of the cap section 80 (in FIG. 5, one side on the side of the second and fourth fixed sections 40 and 60 and one side on the right side of the drawing), along the one side. Further, although described later, the movable electrode pad 84d, to which a carrier wave having predetermined amplitude and wavelength is applied, is formed on a straight line connecting the two movable electrode through-hole electrodes 84b (two anchors 28) in the region overlapped with the peripheral section 70 of the sensor section 10, viewed from the stacking direction. That is, in FIG. 5, the movable electrode pad 84d is formed in a part positioned on the line II-II in the region overlapped with the peripheral section 70 of the sensor section 10. As the movable electrode pad 84d and the first to fourth fixed electrode pads 85d to 88d, with the movable electrode pad 84d as a center, the first and fourth fixed electrode pads 85d and 88d are formed on one side (in FIG. 5, the upper side of the drawing), and the second and fourth fixed electrode pads 86d and 87d are formed on the other side (in FIG. 5, the lower side of the drawing), in the vicinity of the predetermined one side.

Further, viewed from the stacking direction, the movable electrode wiring 84c, and the first to fourth fixed electrode wirings 85c to 88c are formed in a region different from a region overlapped with the comb-teeth structure (first to fourth movable electrodes 24 to 27 and first to fourth fixed electrodes 32 to 62).

Note that the movable electrode wiring 84c is linearly formed such that the length connecting the movable electrode through-hole electrode 84b with the movable electrode pad 84d is the shortest. That is, viewed from the stacking direction, as the movable electrode pad 84d is formed on the straight line connecting the two movable electrode through-hole electrodes 84b (two anchors 28), the movable electrode wiring 84c is formed on the straight line connecting the two movable electrode through-hole electrodes 84b.

Further, in the present embodiment, the movable electrode pad 84d and the first to fourth fixed electrode pads 85d to 88d are formed in the vicinity of one side on the side of the second and fourth fixed sections 40 and 60. The length of wiring is prolonged in the order from the second and fourth fixed electrode wirings 86c and 88c, then the first fixed electrode wiring 85c, and the third fixed electrode wiring 87c (see FIG. 5). Accordingly, viewed from the stacking direction, in the first to fourth fixed electrode wirings 85c to 88c, the width of wiring is narrowed in the order from the second and fourth fixed electrode wirings 86c and 88c, then the first fixed electrode wiring 85c, and the third fixed electrode wiring 87c, so as to obtain equal resistance values by obtaining equal areas. Note that although not particularly described, as the first to fourth fixed electrode wirings 85c to 88c are simultaneously formed by patterning of a metal film formed on the insulating film 83, the wirings have equal thicknesses.

Figure 6:
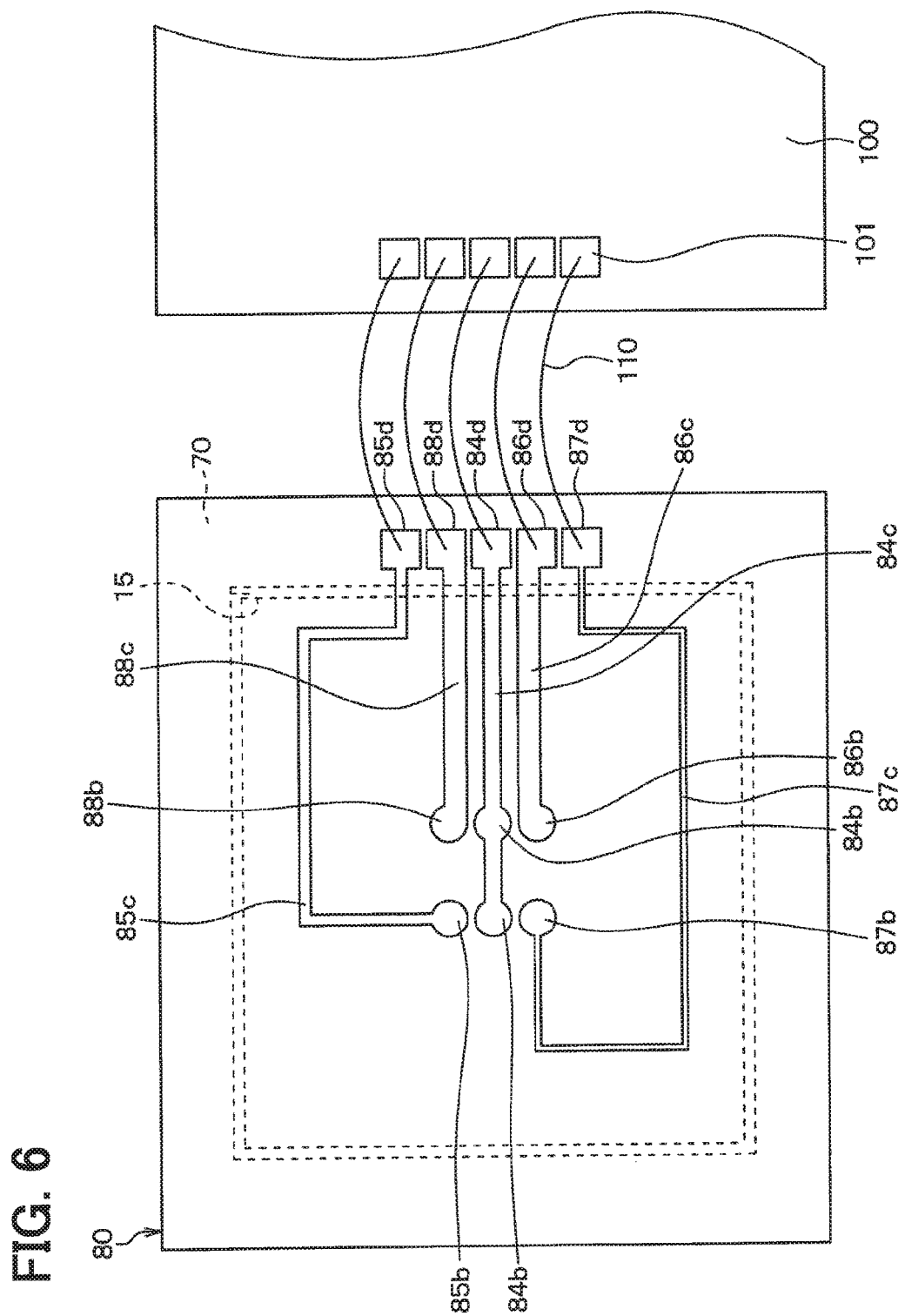
FIG. 6 illustrates a status where the acceleration sensor and a circuit board are electrically connected via wires.

The configuration of the acceleration in the present embodiment is as described above. As shown in FIG. 6, the above-described acceleration sensor is provided next to the circuit board 100. The movable electrode pad 84d and the first to fourth fixed electrode pads 85d to 88d are electrically connected to a plurality of pads 101 formed on the circuit board 100 via wires 110. More particularly, the acceleration sensor is provided next to the circuit board 100 such that the movable electrode pad 84d and the first to fourth fixed electrode pads 85d to 88d (in FIG. 5, the one side on the right side of the drawing) are on the side of the circuit board 100. It is possible to shorten the length of the wires 110 connecting the movable electrode pad 84d and the first to fourth fixed electrode pads 85d to 88d with the circuit board 100, by arranging the acceleration sensor in this manner. Accordingly, it is possible to suppress increase in offset voltage due to parasitic capacitance and influence of extraneous noise, and to suppress decrease in detection accuracy. Note that in FIG. 6, the protective film 90 is omitted. Further, in the present embodiment, the circuit board 100 corresponds to the circuit device.

Next, the operation of the above-described acceleration sensor will be briefly described. In the acceleration sensor, as indicated with capacitor symbols in FIG. 1, first capacitance $C_{s1}$ occurs between the first movable electrode 24 and the first fixed electrode 32, and second capacitance $C_{s2}$ occurs between the second movable electrode 25 and the second fixed electrode 42. Similarly, third capacitance $C_{s3}$ occurs between the third movable electrode 26 and the third fixed electrode 52, and fourth capacitance $C_{s4}$ occurs between the fourth movable electrode 27 and the fourth fixed electrode 62.

Upon detection of acceleration, a carrier wave having predetermined amplitude and wavelength is applied to the first to fourth movable electrodes 24 to 27 (movable electrode pad 84d). In this status, when acceleration in the x-axis direction is applied, the first and second capacitance $C_{s1}$ and $C_{s2}$ change in accordance with displacement of the first and second movable electrodes 24 and 25. Accordingly, the acceleration in the x-axis direction is detected based on the difference between the first capacitance $C_{s1}$ and second capacitance $C_{s2}$ (potential of the first and second fixed electrodes 32 and 42), and the acceleration in the y-axis direction is detected based on the difference between the third capacitance $C_{s3}$ and fourth capacitance $C_{s4}$ (potential of the third and fourth fixed electrodes 52 and 62). That is, in the present embodiment, the movable electrode pad 84d becomes an input terminal.

As described above, in the present embodiment, viewed from the stacking direction, the movable electrode pad 84d and the first to fourth fixed electrode pads 85d to 88d are formed adjacently to each other in the region overlapped with the peripheral section 70 of the sensor section 10. Accordingly, it is possible to shorten the length of the wires 110 connecting the respective pads 84d to 88d of the acceleration sensor with the pads 101 of the circuit board 100 by providing the acceleration sensor and the circuit board 100 such that the movable electrode pad 84d and the first to fourth fixed electrode pads 85d to 88d are on the circuit board 100 side. Accordingly, it is possible to suppress increase in offset voltage due to parasitic capacitance and influence of extraneous noise, and to suppress decrease in detection accuracy.

Further, in the present embodiment, viewed from the stacking direction, the movable electrode wiring 84c and the first to fourth fixed electrode wirings 85c to 88c are formed in the region different from the region overlapped with the comb-teeth structure (first to fourth movable electrodes 24 to 27 and first to fourth fixed electrodes 32 to 62). Accordingly, upon inspection as to whether or not foreign material is held in the comb-teeth structure by transmission of x ray or the like from the stacking direction, it is possible to perform inspection with high accuracy without any hindrance of the transmission of x ray or the like with the movable electrode wiring 84c and the first to fourth fixed electrode wirings 85c to 88c.

Further, viewed from the stacking direction, the movable electrode pad 84d to which the carrier wave is applied is formed on the straight line connecting the two movable electrode through-hole electrodes 84b (two anchors 28). The movable electrode wiring 84c is linearly formed such that the length connecting the movable electrode through-hole electrode 84b to the movable electrode pad 84d is the shortest. Accordingly, the carrier wave also becomes a noise source. However, as the movable electrode wiring 84c to which the carrier wave is applied is short, it is possible to suppress decrease in detection accuracy due to the carrier wave (noise).

Further, viewed from the stacking direction, the first to fourth fixed electrode wirings 85c to 88c, having equal areas, have equal resistance values. Accordingly, it is possible to equalize the electrical influence to the respective wirings 85c to 88c from the resistance values of the respective wirings 85c to 88c. Further, it is possible to suppress decrease in detection accuracy.

Second Embodiment

A second embodiment of the present disclosure will be described. In the present embodiment, in comparison with the first embodiment, a first dummy pad is formed in the cap section 80. The other elements are the same as those in the first embodiment, therefore, explanations of these elements will be omitted here.

Figure 7:
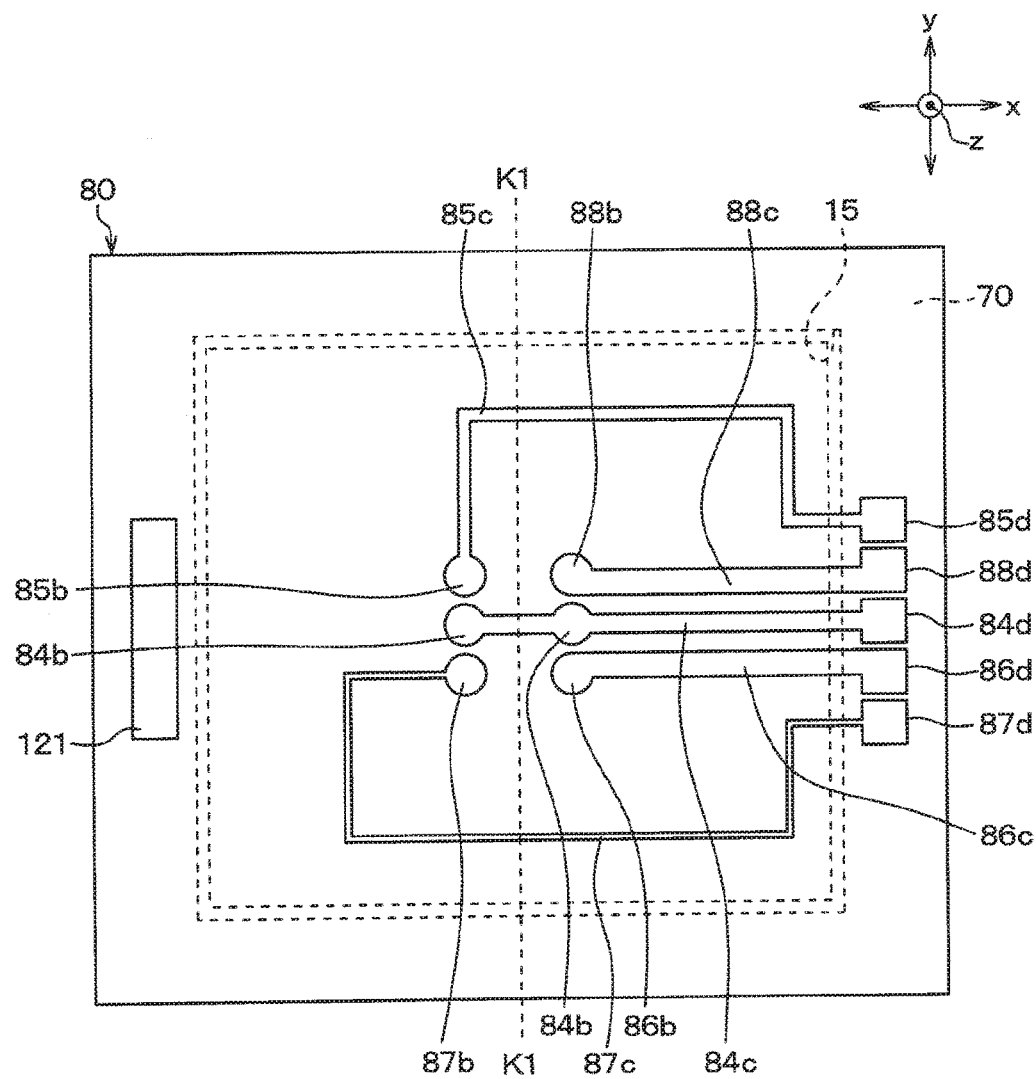
FIG. 7 is a plane schematic diagram of the cap section viewed from the stacking direction of the sensor section and the cap section, according to a second embodiment of the present disclosure.

In the present embodiment, as shown in FIG. 7, in the cap section 80, viewed from the stacking direction, the movable electrode pad 84d and the first to fourth fixed electrode pads 85d to 88d are formed in the vicinity of one side (in FIG. 7, the one side on the right side of the drawing) of a pair of opposing sides. A first dummy pad 121 is formed in the vicinity of the other one side (in FIG. 7, the one side on the left side of the drawing) of the pair of opposing sides. That is, in the cap section 80, viewed from the stacking direction, in the region overlapped with the peripheral section 70, the movable electrode pad 84d and the first to fourth fixed electrode pads 85d to 88d are formed in one of two regions, with the region overlapped with the sensing section 16 between the two regions, and the first dummy pad 121 is formed in the other region. Note that in FIG. 7, the protective film 90 is omitted.

In the present embodiment, the first dummy pad 121 has a rectangular shape in which a direction along the y-axis direction is a longitudinal direction. The area of the dummy pad is equal to the total area of the movable electrode pad 84d and the first to fourth fixed electrode pads 85d to 88d. Note that the first dummy pad 121 is not electrically connected to the first to fourth movable electrodes 24 to 27, the first to fourth fixed electrodes 32 to 62, and the circuit board 100.

According to this configuration, assuming that a virtual line through the center of the acceleration sensor and along the y-axis direction is a first virtual line K1 (see FIG. 7), when the acceleration sensor is distorted due to thermal strain based on the first virtual line K1 as an axis, it is possible to reduce the difference between a deformation amount on the side where the first dummy pad 121 is formed and a deformation amount on the side where the movable electrode pad 84d and the first to fourth fixed electrode pads 85d to 88d are formed. Accordingly, it is possible to suppress variation of the change of the first capacitance $C_{s1}$ to the fourth capacitance $C_{s4}$ due to thermal strain and to suppress decrease in detection accuracy. Further, in the present embodiment, the area of the first dummy pad 121 is equal to the total area of the movable electrode pad 84d and the first to fourth fixed electrode pads 85d to 88d. Accordingly, it is possible to further reduce the difference between the deformation amount on the side where the first dummy pad 121 and the deformation amount on the side where the movable electrode pad 84d and the first to fourth fixed electrode pads 85d to 88d are formed with respect to the first virtual line K1.

Third Embodiment

A third embodiment of the present disclosure will be described. In the present embodiment, in comparison with the second embodiment, a second dummy pad is formed in the cap section 80. The other elements are the same as those in the second embodiment, therefore, explanations of these elements will be omitted here.

Figure 8:
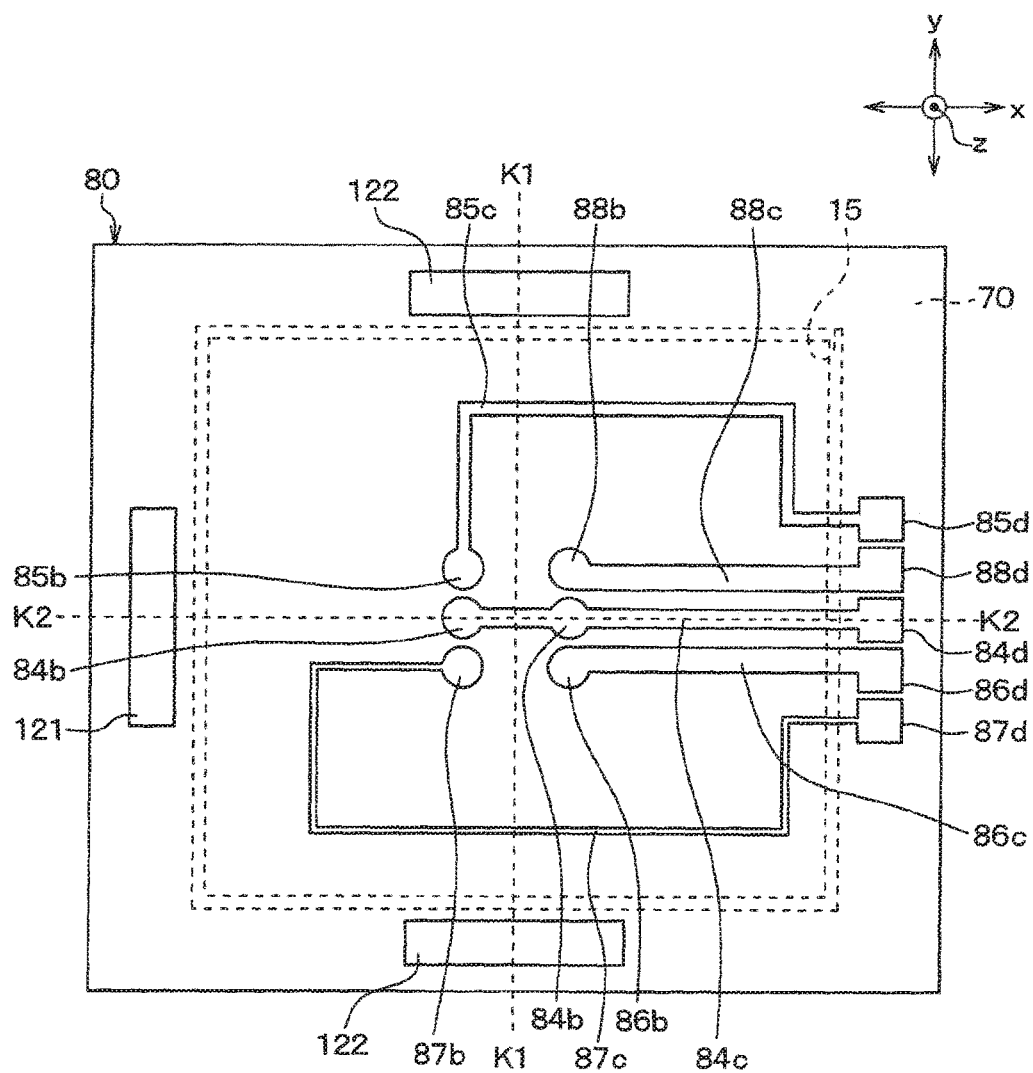
FIG. 8 is a plane schematic diagram of the cap section viewed from the stacking direction of the sensor section and the cap section, according to a third embodiment of the present disclosure.

In the present embodiment, as shown in FIG. 8, in the cap section 80, viewed from the stacking direction, the second dummy pad 122 is respectively formed in the vicinity of each side in one side of the pair of opposing sides different from the one side of the pair of opposing sides where the movable electrode pad 84d, the first to fourth fixed electrode pads 85d to 88d, and the first dummy pad 121 are formed. That is, in the cap section 80, viewed from the stacking direction, in the region overlapped with the peripheral section 70 of the sensor section 10, the second dummy pad 122 is formed in two regions different from the region where the movable electrode pad 84d, the first to fourth fixed electrode pads 85d to 88d, and the first dummy pad 121 are formed, and with the region overlapped with the sensing section 16 between the regions. In the present embodiment, the second dummy pad 122 has a rectangular shape where a direction along the x-axis direction is a longitudinal direction. The area of the dummy pad is equal to the total area of the movable electrode pad 84d and the first to fourth fixed electrode pads 85d to 88d. That is, the area of the first dummy pad 121, the area of the second dummy pad 122, and the total area of the movable electrode pad 84d and the first to fourth fixed electrode pads 85d to 88d are equal to each other.

Note that the second dummy pad 122 is not electrically connected to the first to fourth movable electrodes 24 to 27, the first to fourth fixed electrodes 32 to 62, the circuit board 100 and the like. Further, in FIG. 8, the protective film 90 is omitted.

According to this configuration, assuming that a virtual line through the center of the acceleration sensor and along the x-axis direction is a second virtual line K2 (see FIG. 8), when the acceleration sensor is distorted due to thermal strain based on the first and second virtual lines K1 and K2 as axes, it is possible to reduce the difference between the deformation amounts in the regions where the respective pads 84d to 88dc, 121, and 122 are formed. Accordingly, it is possible to obtain a similar effect to that obtained in the above-described second embodiment while further suppress variation of the change of the first capacitance $C_{s1}$ to the fourth capacitance $C_{s4}$ due to thermal strain. Further, in the present embodiment, as the area of the second dummy pad 122 is equal to the total area of the movable electrode pad 84d and the first to fourth fixed electrode pads 85d to 88d, it is possible to further reduce the difference between the deformation amounts in the regions where the respective pads 84d to 88d, 121, and 122 are formed.

Fourth Embodiment

A fourth embodiment of the present disclosure will be described. In the present embodiment, in comparison with the first embodiment, a first peripheral section pad and the like are formed in the cap section 80. The other elements are the same as those in the first embodiment, therefore, explanations of these elements will be omitted here.

Figure 9:
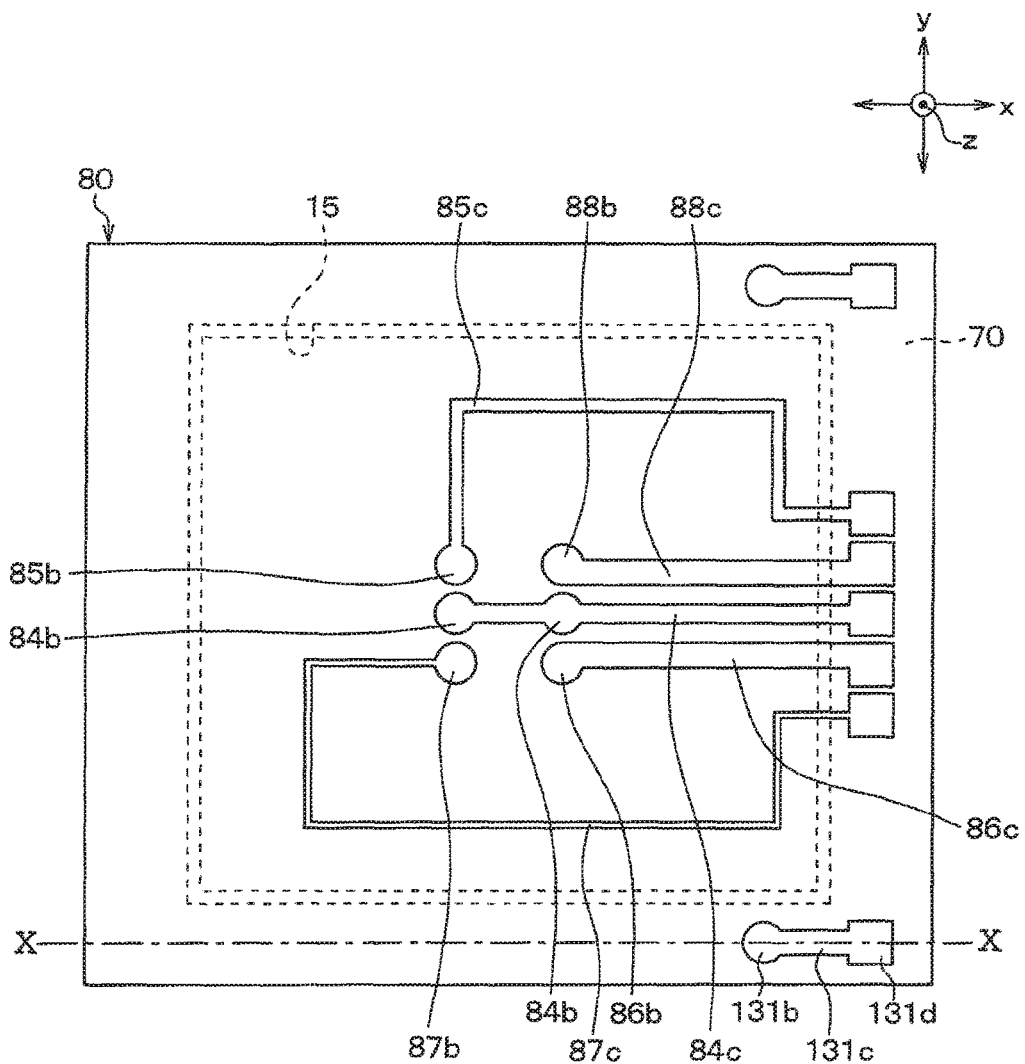
FIG. 9 is a plane schematic diagram of the cap section viewed from the stacking direction of the sensor section and the cap section, according to a fourth embodiment of the present disclosure.
Figure 10:
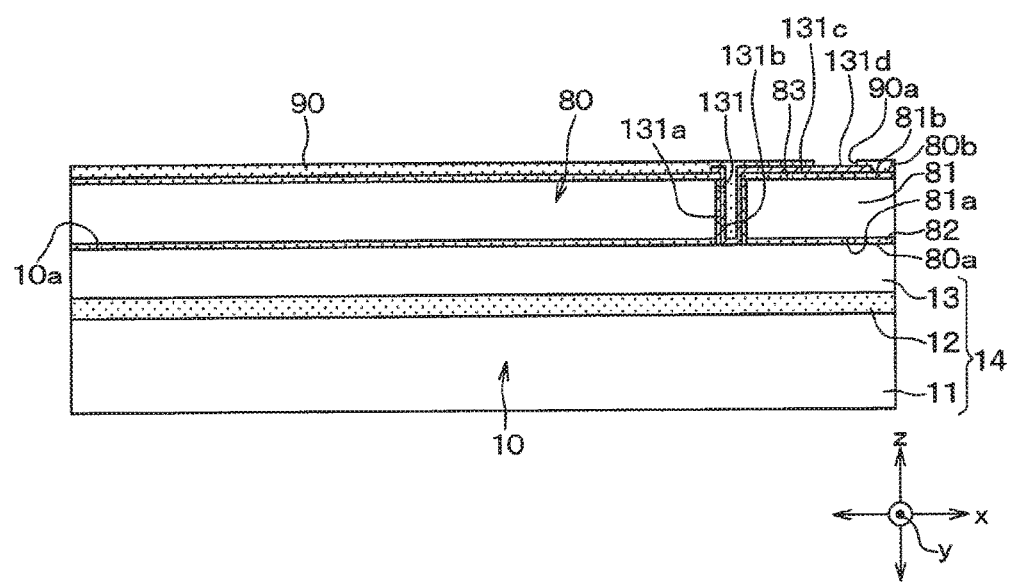
FIG. 10 is a cross sectional view along a line X-X in FIG. 9.

In the present embodiment, as shown in FIGS. 9 and 10, in the cap section 80, viewed from the stacking direction, two first peripheral section pads 131d are formed so as to hold the movable electrode pad 84d and the first to fourth fixed electrode pads 85d to 88d between the two pads. That is, the first peripheral section pads 131d are formed at both ends in the vicinity of the one side on the side where the movable electrode pad 84d and the first to fourth fixed electrode pads 85d to 88d are formed. Note that in FIG. 9, the protective film 90 is omitted.

More particularly, in the cap section 80, two first peripheral section through holes 131 to expose predetermined positions of the peripheral section 70 are formed. In the respective first peripheral section through holes 131, an insulating film 131a is formed on the wall surface, and a first peripheral section through-hole electrode 131b electrically connected to the peripheral section 70 is formed on the insulating film 131a. Further, on the insulating film 83, a first peripheral section wiring 131c electrically connected to the first peripheral section through-hole electrode 131b, and a first peripheral section pad 131d electrically connected to the first peripheral section wiring 131c and electrically connected to the circuit board 100, are formed.

The acceleration sensor is used in a status where the first peripheral section pad 131d is electrically connected to the circuit board 100 via the wire 110 and the peripheral section 70 is maintained at a predetermined potential.

According to this configuration, as the peripheral section 70 is maintained at the predetermined potential, it is possible to suppress change of the potential of the peripheral section 70, and to suppress decrease in detection accuracy. Further, the wire 110 connecting the first peripheral section pad 131d with the circuit board 100 is also maintained at the predetermined potential. These wires 110 hold the wire, electrically connecting the movable electrode pad 84d and the first to fourth fixed electrode pads 85d to 88d with the circuit board 100, between the wires. Accordingly, the wire 110 connecting the first peripheral section pad 131d with the circuit board 100 serves as a guard ring. It is possible to suppress propagation (influence) of external noise to the wires 110 electrically connecting the movable electrode pad 84d and the first to fourth fixed electrode pads 85d to 88d with the circuit board 100.

Fifth Embodiment

A fifth embodiment of the present disclosure will be described. In the present embodiment, in comparison with the fourth embodiment, a second peripheral section electrode pad and the like are formed on the cap section 80. The other elements are the same as those in the first embodiment, therefore, explanations of these elements will be omitted here.

Figure 11:
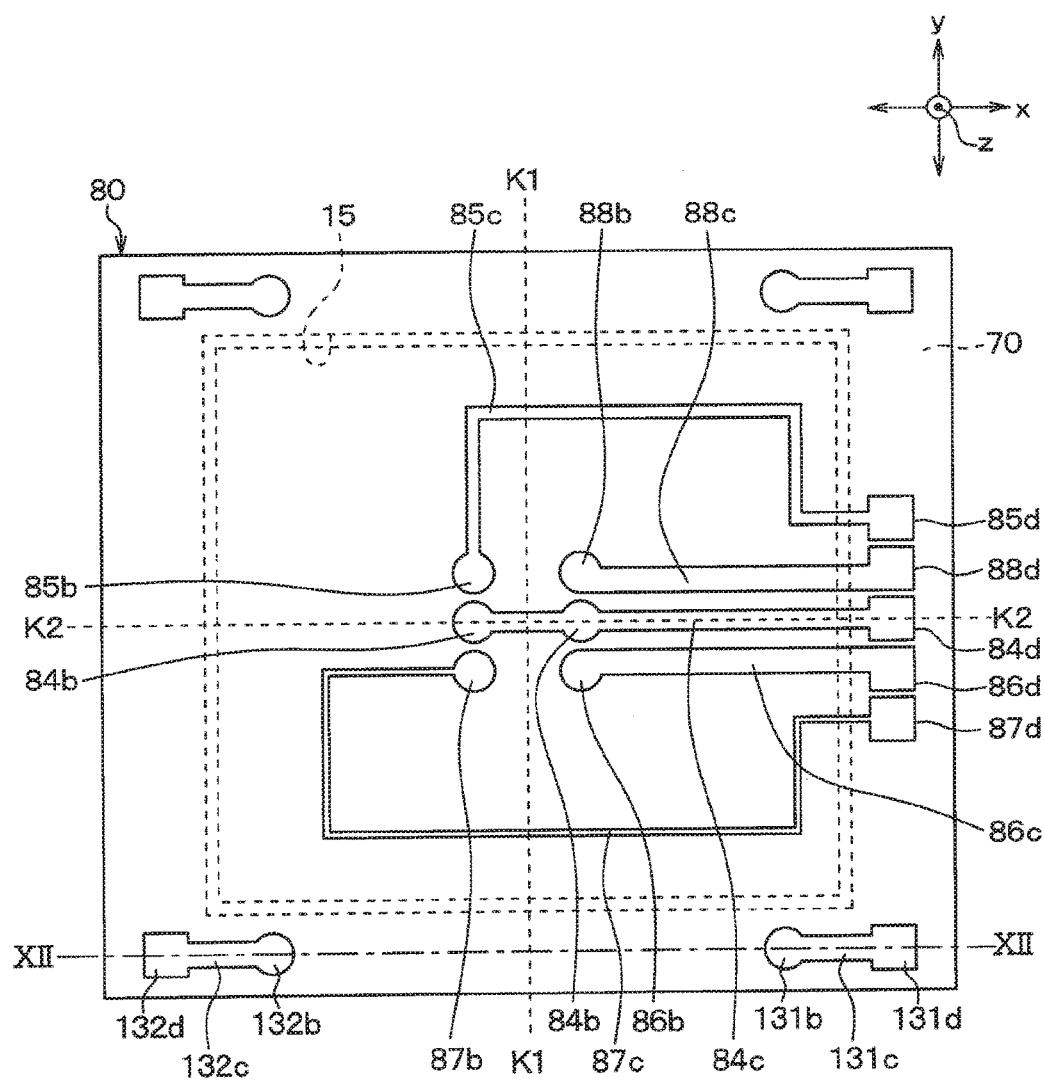
FIG. 11 is a plane schematic diagram of the cap section viewed from the stacking direction of the sensor section and the cap section, according to a fifth embodiment of the present disclosure.
Figure 12:
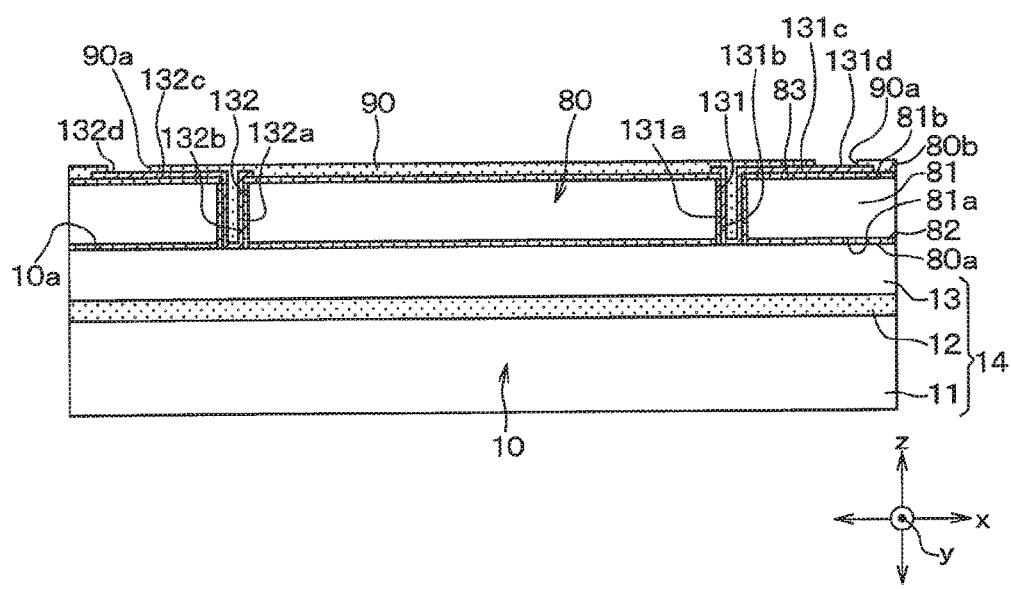
FIG. 12 is a cross sectional view along a line XII-XII in FIG. 11.

In the present embodiment, as shown in FIGS. 11 and 12, in the cap section 80, a second peripheral section pad 132d is formed in the vicinity of both ends of one side opposing one side on the side where the movable electrode pad 84d, the first to fourth fixed electrode pads 85d to 88d, and the first peripheral section pad 131d are formed. More specifically, in the cap section 80, two second peripheral section pads 132d are formed such that the pads and the first peripheral section pads 131d are line symmetrical with respect to the first virtual line K1. That is, in the cap section 80, the first and second peripheral section pads 131d and 132d are formed in the vicinity of the respective corners of the rectangular shape. Note that in FIG. 11, the protective film 90 is omitted. Further; in the present embodiment, the first virtual line K1 is parallel to the straight line connecting the two first peripheral section pads 131d.

More particularly, in the cap section 80, a second peripheral section through hole 132 to expose a predetermined part of the peripheral section 70 is formed. In the second peripheral section through hole 132, an insulating film 132a is formed on the wall surface, and a second peripheral section through-hole electrode 132b connected to the peripheral section 70 is formed on the insulating film 132a. A second peripheral section wiring 132c connected to the second peripheral section through-hole electrode 132b and a second peripheral section pad 132d connected to the second peripheral section wiring 132c are formed on the insulating film 83. Note that in the present embodiment, as in the case of the first peripheral section pad 131d, the second peripheral section pad 132d is electrically connected to the circuit board 100 via the wire 110.

According to this configuration, as the first and second peripheral section pads 131d and 132d are formed in the vicinity of the respective corners in the cap section 80, when the acceleration sensor is distorted based on the first and second virtual lines K1 and K2 as axes (see FIG. 11), it is possible to reduce the difference between the deformation amounts in the regions where the first and second peripheral section pads 131d and 132d are formed. Accordingly, it is possible to suppress variation of the change of the first capacitance $C_{s1}$ to the fourth capacitance $C_{s4}$ due to thermal strain and to obtain a similar effect to that obtained in the above-described fourth embodiment while further suppress decrease in detection accuracy.

Further, in the present embodiment, as the second peripheral section pad 132d is also connected to the circuit board 100 via the wire 110, it is possible with the wire 110 to suppress propagation of external noise to the wires 110 electrically connecting the movable electrode pad 84d and the first to fourth fixed electrode pads 85d to 88d with the circuit board 100. Note that here an example where the second peripheral section pads 132d is connected to the circuit board 100 via the wire 110 has been described. As the potential of the peripheral section 70 is maintained at the predetermined potential with the peripheral section pad 131*d* (first peripheral section through-hole electrode 131*b*), it is not necessary to electrically connect the second peripheral section pad 132*d* to the circuit board 100.

Sixth Embodiment

A sixth embodiment of the present disclosure will be described. In the present embodiment, in comparison with the first embodiment, the arrangement relationship between the movable electrode pad 84*d* and the first to fourth fixed electrode pads 85*d* to 88*d* is changed. The other elements are the same as those in the first embodiment, therefore, explanations of these elements will be omitted here.

Figure 13:
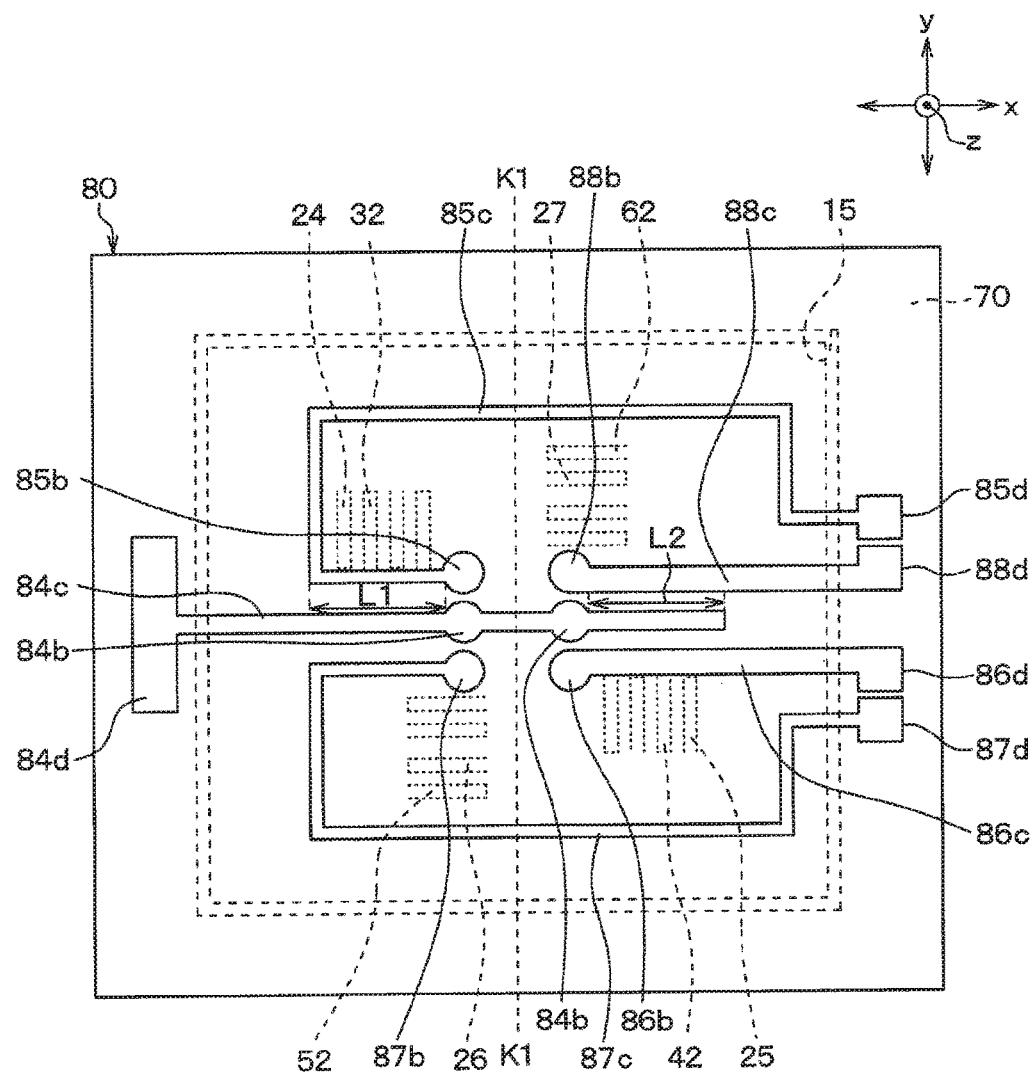
FIG. 13 is a plane schematic diagram of the cap section viewed from the stacking direction of the sensor section and the cap section, according to a sixth embodiment of the present disclosure.

In the present embodiment, as shown in FIG. 13, viewed from the stacking direction, the movable electrode pad 84*d* is formed in the vicinity of approximate central part of the one side of the one side of the pair of opposing sides (in FIG. 13, one side on the left side of the drawing), and the first to fourth fixed electrode pads 85*d* to 88*d* are formed in the vicinity of the other one side (in FIG. 13, one side on the right side of the drawing). That is, viewed from the stacking direction, in the region overlapped with the peripheral section 70, the movable electrode pad 84*d* and the first to fourth fixed electrode pads 85*d* to 88*d* are formed in two regions, with the region overlapped with the sensing section 16 between the two regions. In the present embodiment, the area of the movable electrode pad 84*d* is equal to the total area of the first to fourth fixed electrode pads 85*d* to 88*d*. Note that in FIG. 13, the protective film 90 is omitted.

Further, the movable electrode wiring 84*c* and the first to fourth fixed electrode wirings 85*c* to 88*c* are formed such that a length L1 of a part where the movable electrode wiring 84*c* and the first and third fixed electrode wirings 85*c* and 87*c* are adjacent to each other is equal to a length L2 of a part where the movable electrode wiring 84*c* and the second and fourth fixed electrode wirings 86*c* and 88*c* are adjacent to each other. That is, the movable electrode wiring 84*c* and the first to fourth fixed electrode wirings 85*c* to 88*c* are formed such that the length L1 of a part where the movable electrode wiring 84*c* and the first and third fixed electrode wirings 85*c* and 87*c* are parallel to each other is equal to the length L2 of a part where the movable electrode wiring 84*c* and the electrode wirings 86*c* and 88*c* are parallel to each other.

Further, in the present embodiment, the length of wiring is prolonged in the order from the second and fourth fixed electrode wirings 86*c* and 88*c*, and the first and third fixed electrode wirings 85*c* and 87*c*. Accordingly, viewed from the stacking direction, in the first to fourth fixed electrode wirings 85*c* to 88*c*, the width of wiring is narrowed in the order from the second and fourth fixed electrode wirings 86*c* and 88*c*, and the first and third fixed electrode wirings 85*c* and 87*c*, so as to obtain equal resistance values by obtaining equal areas.

Figure 14:
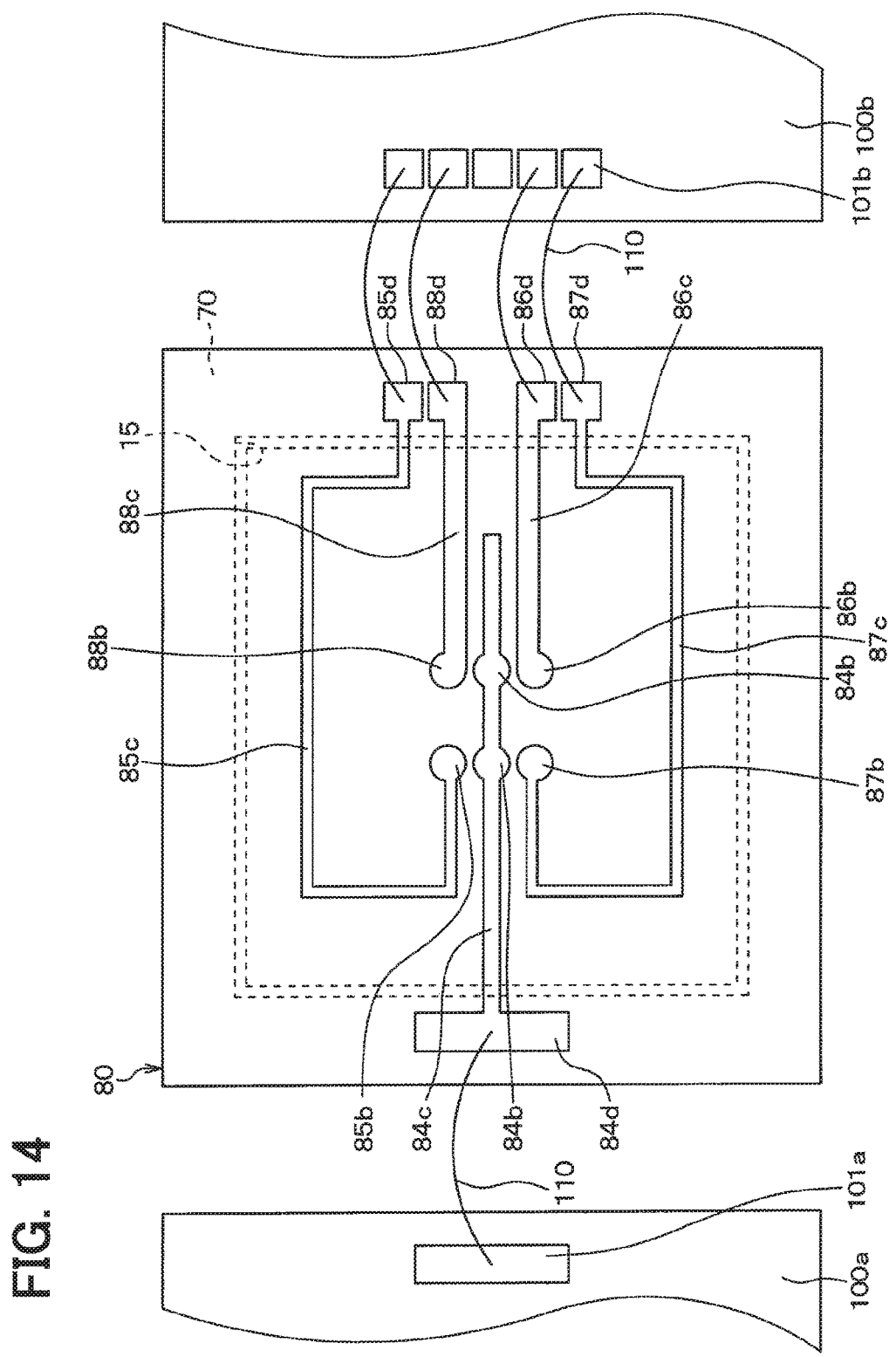
FIG. 14 illustrates a status where the acceleration sensor shown in FIG. 13 and the circuit board are electrically connected via the wires.

As shown in FIG. 14, this acceleration sensor is provided next to first and second circuit board 100*a* and 100*b* such that the movable electrode pad 84*d* is on the side of the first circuit board 100*a* and the first to fourth fixed electrode pads 85*d* to 88*d* are on the side of the second circuit board 100*b*. The acceleration sensor is used in a status where the movable electrode pad 84*d* is electrically connected to a pad 101*a* formed on the first circuit board 100*a* via the wire 110, and the first to fourth fixed electrode pads 85*d* to 88*d* are electrically connected to pads 101*b* formed on the second circuit board 100*b* via the wires 110. That is, the acceleration sensor is used in a status where the movable electrode pad 84*d* and the first to fourth fixed electrode pads 85*d* to 88*d* are electrically connected to the different first and second circuit boards 100*a* and 100*b*. Note that in FIG. 14, the protective film 90 is omitted.

According to this configuration, it is possible to shorten the length of the wires 110 connecting the respective pads 84*d* to 88*d* of the acceleration sensor with the pads 101*a* and 101*b* of the first and second circuit boards 100*a* and 100*b* by providing the acceleration sensor and the first and second circuit boards 100*a* and 100*b* such that the movable electrode pad 84*d* is on the side of the first circuit board 100*a* and the first to fourth fixed electrode pads 85*d* to 88*d* are on the side of the second circuit board 100*b*. Accordingly it is possible to obtain a similar effect to that obtained in the above-described first embodiment.

Further, though the carrier wave applied to the movable electrode pad 84*d* becomes a noise source, the first to fourth fixed electrode pads 85*d* to 88*d* are provided away from the movable electrode pad 84*d*. Accordingly, it is possible to suppress decrease in detection accuracy due to the carrier wave.

Further, the area of the movable electrode pad 84*d* is equal to the total area of the first to fourth fixed electrode pads 85*d* to 88*d*. Accordingly, when the acceleration sensor is distorted due to thermal strain based on the as first virtual line K1 an axis (see FIG. 13), it is possible to reduce the difference between the deformation amount on the side where the movable electrode pad 84*d* is formed and the deformation amount on the side where the first to fourth fixed electrode pads 85*d* to 88*d* are formed.

Further, the length L1 of a part where the movable electrode wiring 84*c* and the first and third fixed electrode wirings 85*c* and 87*c* are adjacent to each other is equal to the length L2 where the movable electrode wiring 84*c* and the second and fourth fixed electrode wirings 86*c* and 88*c* are adjacent to each other. The first to fourth fixed electrode wirings 85*c* to 88*c* are similarly influenced by the carrier wave from the movable electrode wiring 84*c*. Accordingly, it is possible to suppress change of only the potential of the specific wirings 85*c* to 88*c*.

Note that in the above-described first to fifth embodiments, it may be configured such that the length L1 of a part where the movable electrode wiring 84*c* and the first and third fixed electrode wirings 85*c* and 87*c* are adjacent to each other is equal to the length L2 where the movable electrode wiring 84*c* and the second and fourth fixed electrode wirings 86*c* and 88*c* are adjacent to each other by appropriately drawing the movable electrode wiring 84*c*, and the first to fourth fixed electrode wirings 85*c* to 88*c*.

Seventh Embodiment

A seventh embodiment of the present disclosure will be described. The present embodiment is a combination of the above-described sixth embodiment and the above-described third embodiment. The other elements are the same as those in the first embodiment, therefore, explanations of these elements will be omitted here.

Figure 15:
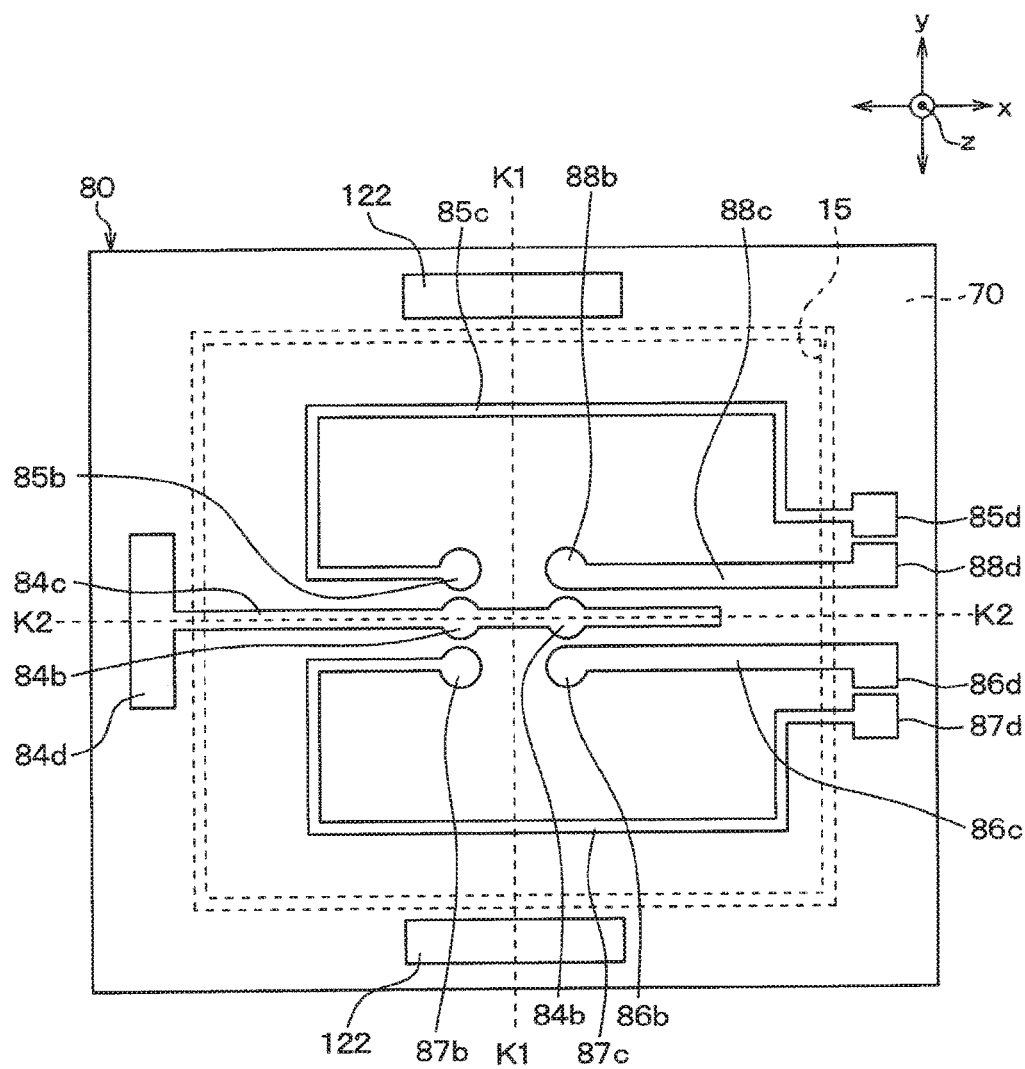
FIG. 15 is a plane schematic diagram of the cap section viewed from the stacking direction of the sensor section and the cap section, according to a seventh embodiment of the present disclosure.

In the present embodiment, as shown in FIG. 15, viewed from the stacking direction, in the cap section 80, the dummy pad 122 is respectively formed in the vicinity of each side in one of the pair of opposing sides, different from the pair of opposing sides where the movable electrode pad 84*d* and the first to fourth fixed electrode pads 85*d* to 88*d* are formed (in FIG. 15, the upper side and the lower side of the drawing). That is, in the cap section 80, viewed from the stacking direction, in the region overlapped with the peripheral section 70 of the sensor section 10, the dummy pad 122 is respectively formed in two regions different from the region where the movable electrode pad 84d and the first to fourth fixed electrode pads 85d to 88d are formed, and with the region overlapped with the sensing section 16 between the regions. In the present embodiment, the area of the respective dummy pads 122 is mutually equal to the total area of the movable electrode pad 84d and the first to fourth fixed electrode pads 85d to 88d. Note that the dummy pad 122 is not electrically connected to the first to fourth movable electrodes 24 to 27, the first to fourth fixed electrodes 32 to 62, the first and second circuit boards 100a and 100b and the like. Further, in FIG. 15, the protective film 90 is omitted.

According to this configuration, when the acceleration sensor is distorted due to thermal strain based on the first and second virtual lines K1 and K2 as axes, through the center of the acceleration sensor, it is possible to reduce the difference among the deformation amounts in the regions where the respective pads 84d to 88d, and 122 are formed. Accordingly, it is possible to suppress variation of the change of the first capacitance $C_{s1}$ to the fourth capacitance $C_{s4}$ due to thermal strain and to further suppress decrease in detection accuracy. Further, in the present embodiment, the area of the dummy pad 122 is mutually equal to the total area of the movable electrode pad 84d, and the first to fourth fixed electrode pads 85d to 88d. Accordingly, it is possible to further reduce the difference among the deformation amounts in the regions where the respective pads 84d to 88d, and 122.

Eighth Embodiment

An eighth embodiment of the present disclosure will be described. The present embodiment is a combination of the above-described sixth embodiment and the above-described fourth embodiment. The other elements are the same as those in the sixth embodiment, therefore, explanations of these elements will be omitted here.

Figure 16:
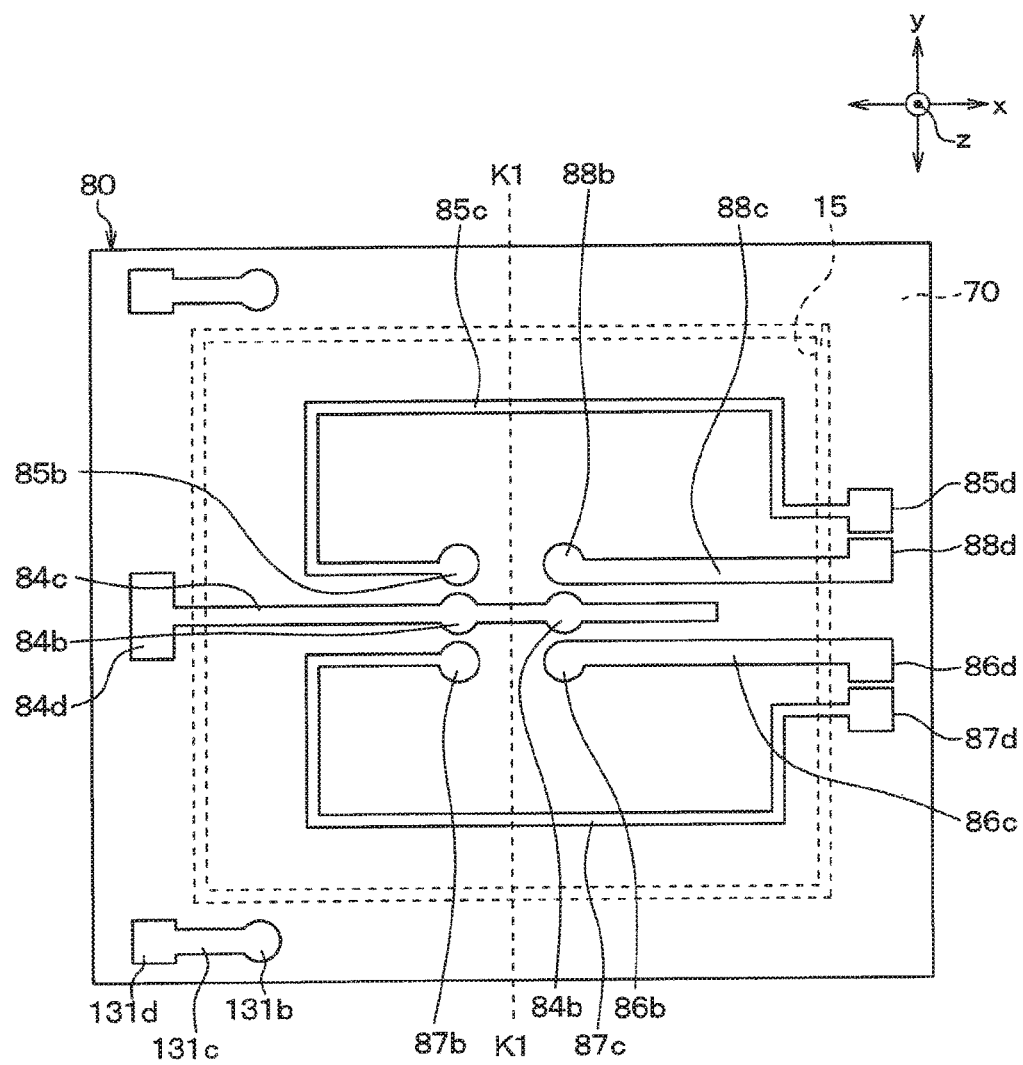
FIG. 16 is a plane schematic diagram of the cap section viewed from the stacking direction of the sensor section and the cap section, according to an eighth embodiment of the present disclosure.

In the present embodiment, as shown in FIG. 16, in the cap section 80, two first peripheral section pads 131d are formed so as to hold the movable electrode pad 84d between the pads. Although not particularly illustrated regarding the cross sectional view, as in the case of the above-described fourth embodiment (see FIG. 10), the first peripheral section through hole 131 to expose a predetermined part of the peripheral section 70 is formed in the cap section 80. In the first peripheral section through hole 131, the insulating film 131a is formed on the wall surface, and the first peripheral section through-hole electrode 131b electrically connected to the peripheral section 70 is formed on the insulating film 131a. The first peripheral section wiring 131c electrically connected to the first peripheral section through-hole electrode 131b, and the first peripheral section pad 131d electrically connected to the first peripheral section wiring 131c and electrically connected to the first circuit board 100a are formed on the insulating film 83. Note that in FIG. 16, the protective film 90 is omitted.

Further, in the present embodiment, the total area of the movable electrode pad 84d and the first peripheral section pad 131d is equal to the total area of the first to fourth fixed electrodes 85d to 88d.

This acceleration sensor is used in a status where the first peripheral section pad 131d is electrically connected to the pad 101a formed on the first circuit board 100a via the wire 110.

According to the configuration, as the peripheral section 70 is maintained at a predetermined potential, it is possible to suppress change of the potential of the peripheral section 70, and to suppress decrease in detection accuracy. Further, the wire 110 connecting the first peripheral section pad 131d with the pad 101a of the first circuit board 100a is also maintained at a predetermined potential. The wire 110 electrically connecting the movable electrode pad 84d with the first circuit board 100a is held between the wires 110. Especially, in the present embodiment, the carrier wave (input signal) is applied to the movable electrode pad 84d (the first to fourth movable electrodes 24 to 27), and the carrier wave becomes a noise source to the first to fourth fixed electrode pads 85d to 88d (first to fourth fixed electrodes 32 to 62, output signal). Accordingly, it is possible to suppress the influence of the carrier wave on the first to fourth fixed electrode pads 85d to 88d (first to fourth fixed electrodes 32 to 62) by holding the wire 110 connecting the movable electrode pad 84d with the pad 101a of the first circuit board 100a between the wires 110 connecting the first peripheral section pads 131d with the pads 101a of the first circuit board 100a.

Further, the total area of the movable electrode pad 84d and the first peripheral section pads 131d is equal to the total area of the first to fourth fixed electrodes 85d to 88d. Accordingly, when the acceleration sensor is distorted based on the first virtual line K1 as an axis (see FIG. 16), it is possible to reduce the difference between the deformation amount in the region on the side where the movable electrode pad 84d and the first peripheral section pads 131d are formed and the deformation amount in the region on the side where the first to fourth fixed electrode pads 85d to 88d are formed. Accordingly, it is possible to suppress variation of the change of the first capacitance $C_{s1}$ to the fourth capacitance $C_{s4}$ due to thermal strain and to suppress decrease in detection accuracy. Note that the first virtual line K1 is parallel to the straight line connecting the two first peripheral section pads 131d.

Ninth Embodiment

A ninth embodiment of the present disclosure will be described. The present embodiment is a combination of the above-described sixth embodiment and the above-described fifth embodiment. The other elements are the same as those in the sixth embodiment, therefore, explanations of these elements will be omitted here.

Figure 17:
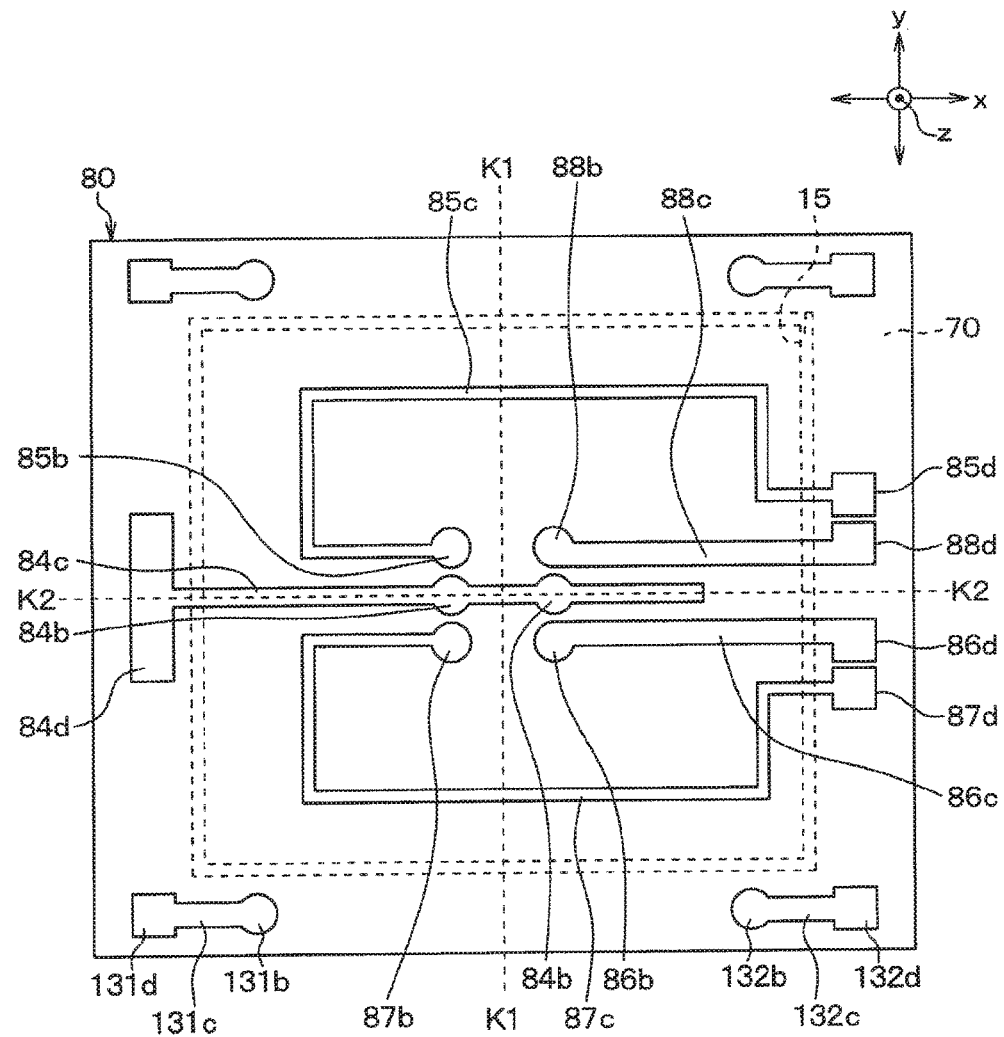
FIG. 17 is a plane schematic diagram of the cap section viewed from the stacking direction of the sensor section and the cap section, according to a ninth embodiment of the present disclosure.

In the present embodiment, as shown in FIG. 17, in the cap section 80, two second peripheral section pads 132d are formed so as to hold the first to fourth fixed electrode pads 85d to 88d between the second peripheral section pads. That is, in the cap section 80, the second peripheral section pads 132d are formed in the vicinity of both ends of one side opposing the one side on the side where the first peripheral section pads 131d are formed. More specifically, in the cap section 80, the two second peripheral section pads 132d are formed so as to be point symmetrical with the first peripheral section pads 131d with respect to the first virtual line K1. That is, in the cap section 80, the first and second peripheral section pads 131d and 132d are formed in the vicinity of the respective corners of the rectangular shape. Note that in FIG. 17, the protective film 90 is omitted. Further, in the present embodiment, the first virtual line K1 is parallel to the straight line connecting the two first peripheral section pads 131d. In the present embodiment, the total area of the movable electrode pad 84d and the first peripheral section pads 131d is equal to the total area of the first to fourth fixed electrode pads 85d to 88d and the second peripheral section pads 132d.

Although not particularly illustrated regarding the cross sectional view, as in the case of the above-described fifth embodiment (see FIG. 12), the second peripheral section through hole 132 to expose the peripheral section 70 is formed in the cap section 80. In the second peripheral section through hole 132, the insulating film 132a is formed on the wall surface, and the second peripheral section through-hole electrode 132b electrically connected to the peripheral section 70 is formed on the insulating film 132a. On the insulating film 83, the second peripheral section wiring 132c electrically connected to the second peripheral section through-hole electrode 132b, and the second peripheral section pad 132d electrically connected to the second peripheral section wiring 132c and electrically connected to the second circuit board 100b are formed.

This acceleration sensor is used in a status where the second peripheral section pad 132d is electrically connected to the pad 101b formed on the second circuit board 100b via the wire 110.

According to this configuration, the first and second peripheral section pads 131d and 132d are formed in the vicinity of the respective corners in the cap section 80. Accordingly, when the acceleration sensor is distorted based on the first and second virtual lines K1 and K2 as axes (see FIG. 17), it is possible to reduce the difference between the deformation amounts in the regions where the first and second peripheral section pads 131d and 132d are formed. Accordingly, it is possible to suppress variation of the change of the first capacitance $C_{s1}$ to the fourth capacitance $C_{s4}$ due to thermal strain.

Further, the total area of the movable electrode pad 84d and the first peripheral section pad 131d is equal to the total area of the first to fourth fixed electrode pads 85d to 88d and the second peripheral section pad 132d. Accordingly, when the acceleration sensor is distorted based on the first virtual line K1 as an axis (see FIG. 17), it is possible to reduce the difference between the deformation amount on the side where the movable electrode pad 84d and the first peripheral section pad 131d are formed and the deformation amount on the side where first to fourth fixed electrode pads 85d to 88d and the second peripheral section pad 132d.

Further, in the present embodiment, the second peripheral section pad 132d is also electrically connected to the second circuit board 100b via the wire 110. Accordingly, it is possible with the wire 110 to suppress propagation of external noise to the wires 110 connecting the first to fourth fixed electrode pads 85d to 88d with the second circuit board 100b.

Note that an example where the second peripheral section pad 132d is connected to the second circuit board 100b via the wire 110 has been described here, however, as the potential of the peripheral section 70 is maintained at a predetermined potential with the first peripheral section pad 131d (the first peripheral section through-hole electrode 131b), it is not necessary to electrically connect the second peripheral section pad 132d to the second circuit board 100b.

Tenth Embodiment

A tenth embodiment of the present disclosure will be described. In the present embodiment, in comparison with the above-described sixth embodiment, the arrangement relationship between the movable electrode pad 84d and the first to fourth fixed electrode pads 85d to 88d is changed. The other elements are the same as those in the first embodiment, therefore, explanations of these elements will be omitted here.

Figure 18:
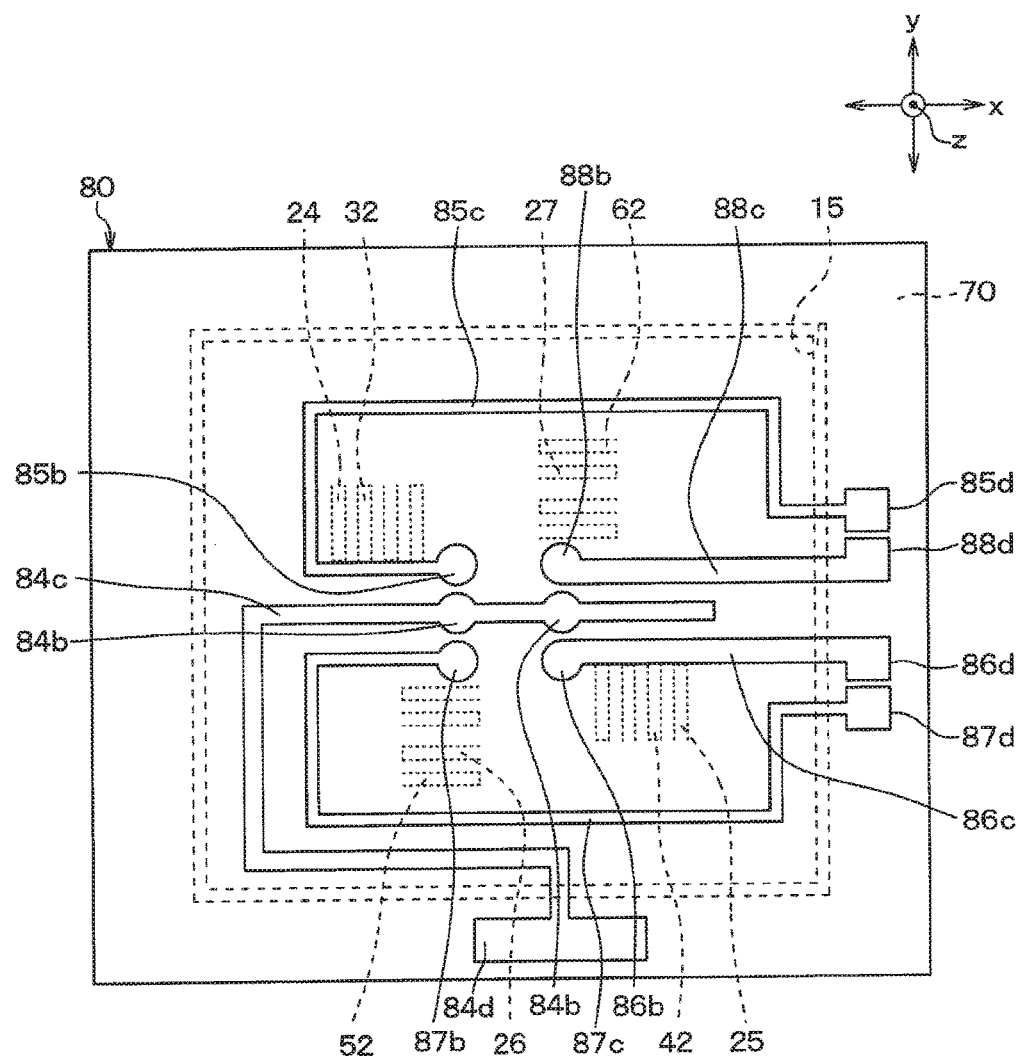
FIG. 18 is a plane schematic diagram of the cap section viewed from the stacking direction of the sensor section and the cap section, according to a tenth embodiment of the present disclosure.

In the present embodiment, as shown in FIG. 18, viewed from the stacking direction, the first to fourth fixed electrode pads 85d to 88d are formed in the vicinity of the one side of the one side of the pair of opposing sides (in FIG. 18, one side on the right side of the drawing), and the movable electrode pad 84d is formed in an approximate central part of the one side of the pair of opposing sides different from the one side of the pair of opposing sides where the first to fourth fixed electrode pads 85d to 88d are formed (in FIG. 18, one side on the lower side of the drawing). Note that in FIG. 18, the protective film 90 is omitted.

In this acceleration sensor, it is possible to obtain a similar effect to that obtained in the above-described first embodiment by providing the acceleration sensor and the first and second circuit boards 100a and 100b such that the movable electrode pad 84d is on the side of the first circuit board 100a, and the first to fourth fixed electrode pads 85d to 88d is on the side of the second circuit board 100b. Further, as the movable electrode pad 84d and the first to fourth fixed electrode pads 85d to 88d are provided away from each other, it is possible to suppress decrease in detection accuracy due to the influence of the carrier wave as in the case of the above-described sixth embodiment.

Other Embodiments

For example, in the above-described respective embodiments, the example where the present disclosure is applied to the acceleration sensor to detect acceleration in the x-axis direction and the y-axis direction has been described. However, the present disclosure is applicable to an acceleration sensor to detect only acceleration in the x-axis direction or only the y-axis direction. That is, the present disclosure is applicable to an acceleration sensor having a connection part at an approximately central part of the sensor section 10 (SOI substrate 14).

Further, in the above-described second embodiment, the area of the first dummy pad 121 may be different from the total area of the movable electrode pad 84d and the first to fourth fixed electrode pads 85d to 88d. In the above-described third embodiment, the area of the second dummy pad 122 may be different from the total area of the movable electrode pad 84d and the first to fourth fixed electrode pads 85d to 88d. Similarly, in the seventh embodiment, the area of the dummy pad 122 may be different from the total area of the movable electrode pad 84d and the first to fourth fixed electrode pads 85d to 88d. In the above-described sixth embodiment, the area of the movable electrode pad 84d may be different from the total area of the first to fourth fixed electrode pads 85d to 88d.

Further, in the above-described fifth and ninth embodiments, it is not necessary to symmetrically form the first peripheral section pad 131d and the second peripheral section pad 132d with the first virtual line K1 as an axis.

In the above-described respective embodiments, it is preferable that the center of gravity of the sensing section 16 corresponds with the entire center of gravity of the acceleration sensor including the respective pads 84d to 88d by appropriately controlling the width or the like of the peripheral section 70. That is, it is preferable that the center of gravity of the sensing section 16 corresponds with the center of gravity of the sensor section 10 and the cap section 80 including the respective pads 84d to 88d, 121, and 122. According to this configuration, when the acceleration sensor is distorted due to thermal strain, the sensing section 16 and the entire acceleration sensor are displaced in the same way. Accordingly, it is possible to suppress variation of the change of the first capacitance $C_{s1}$ to the fourth capacitance $C_{s4}$ due to thermal strain, and to suppress decrease in detection accuracy.

Further, in the above-described respective embodiments, it may be configured such that a predetermined potential is applied to the movable electrode pad 84d (first to fourth movable electrodes 24 to 27), and the carrier wave is applied to the first to fourth fixed electrode pads 85d to 88d (first to fourth fixed electrodes 32 to 62).

Figure 19:
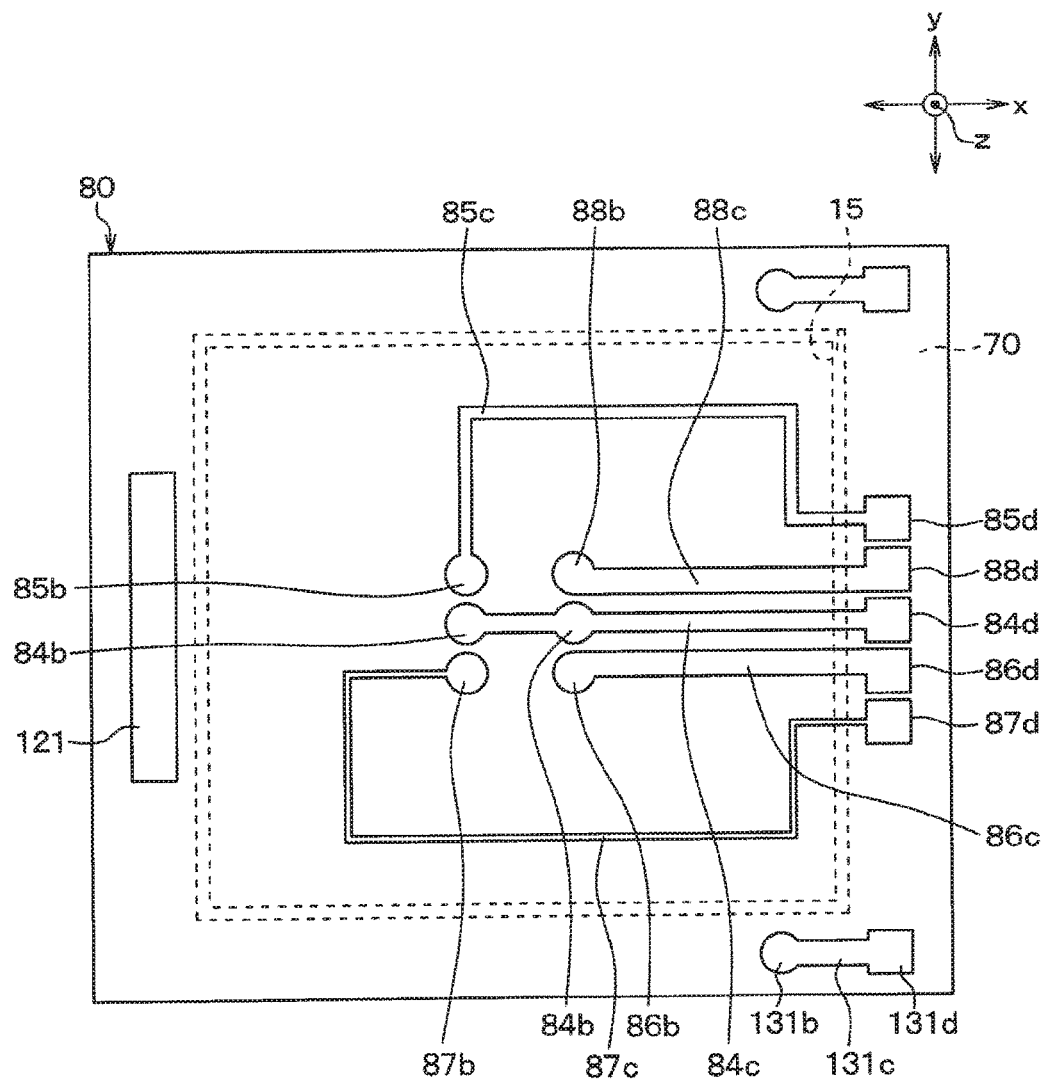
FIG. 19 is a plane schematic diagram of the cap section viewed from the stacking direction of the sensor section and the cap section, according to another embodiment of the present disclosure.
Figure 20:
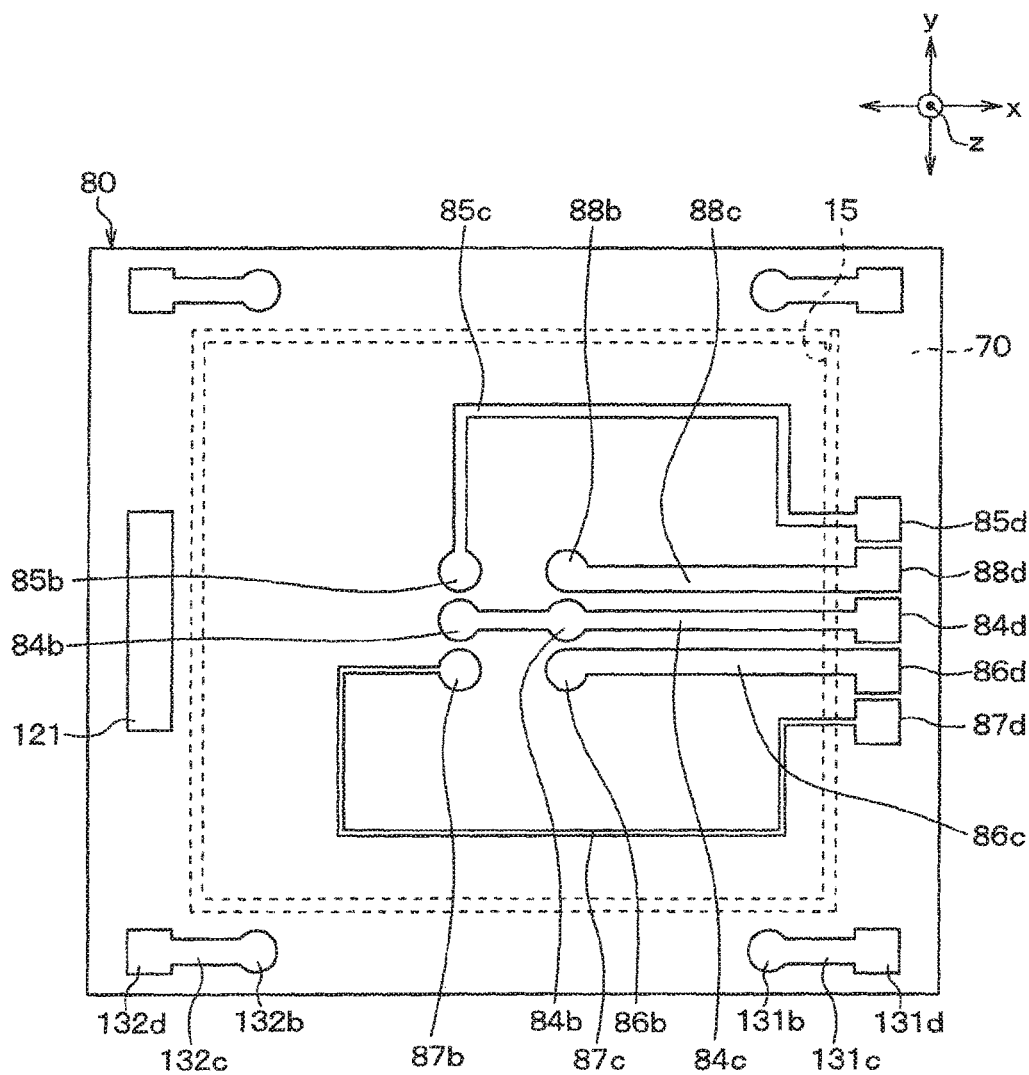
FIG. 20 is a plane schematic diagram of the cap section viewed from the stacking direction of the sensor section and the cap section, according to another embodiment of the present disclosure.

Further, the acceleration sensor may be an appropriate combination of the above-described respective embodiments. For example, an acceleration sensor as an arbitrary combination of the above-described second to fifth embodiments, appropriately having first and second dummy pads 121 and 122, the first and second peripheral section pads 131d and 132d, and the like. Note that when the above-described second embodiment is combined with the above-described fourth embodiment, as shown in FIG. 19, it is preferable that the area of the first dummy pad 121 is equal to the total area of the movable electrode pad 84d, the first to fourth fixed electrode pads 85d to 88d, and the first peripheral section pad 131d. Further, when the above-described second embodiment is combined with the above-described fifth embodiment, as shown in FIG. 20, it is preferable that the total area of the first dummy pad 121 and the second peripheral section pad 132d is equal to the total area of the movable electrode pad 84d, the first to fourth fixed electrode pads 85d to 88d, and the first peripheral section pad 131d.

Figure 21:
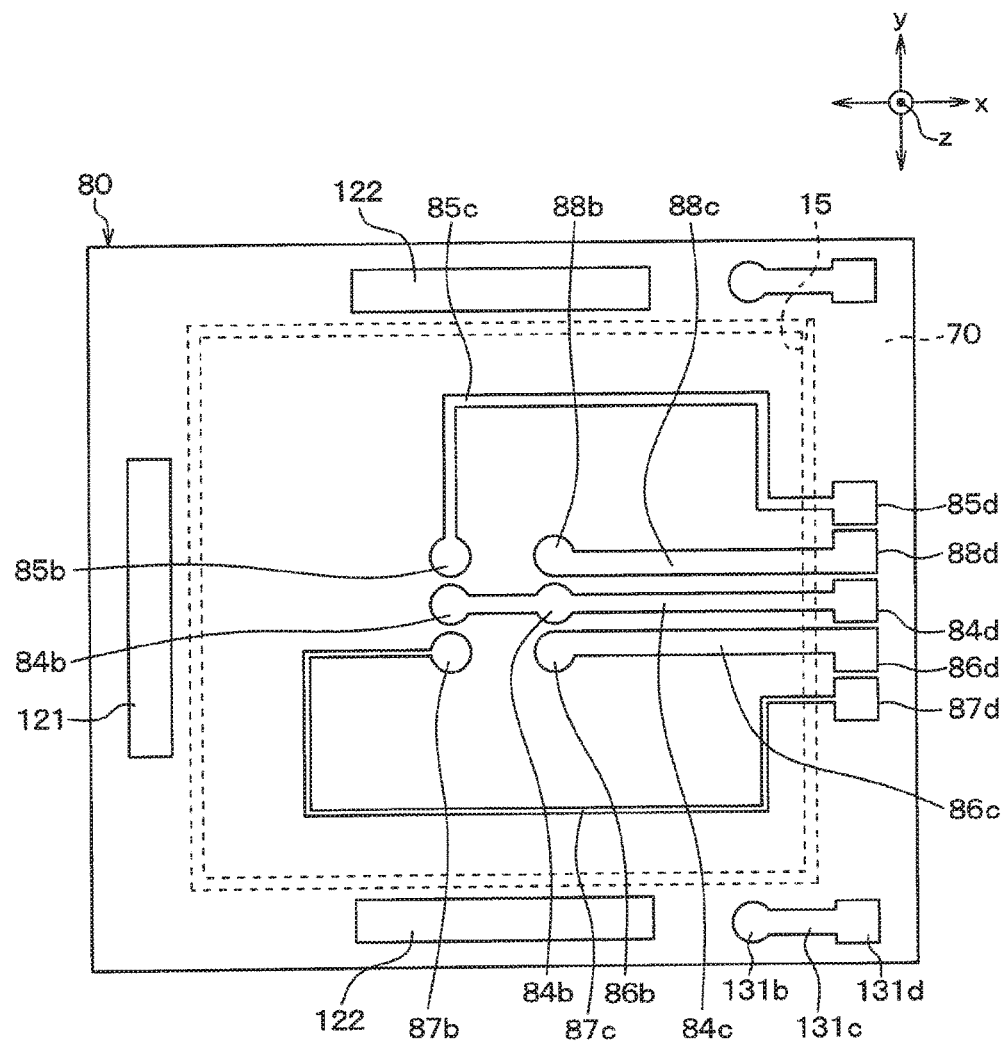
FIG. 21 is a plane schematic diagram of the cap section viewed from the stacking direction of the sensor section and the cap section, according to another embodiment of the present disclosure.
Figure 22:
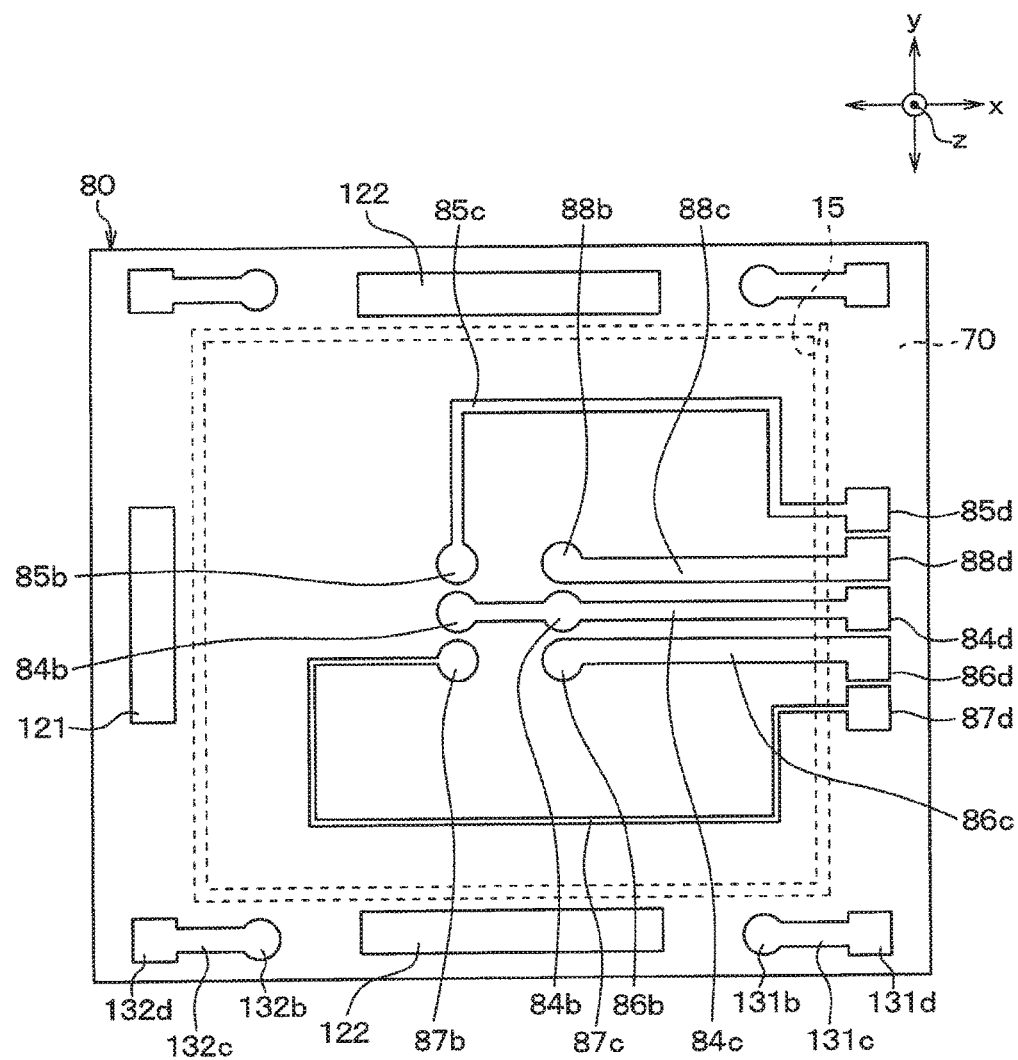
FIG. 22 is a plane schematic diagram of the cap section viewed from the stacking direction of the sensor section and the cap section, according to another embodiment of the present disclosure.

Further, when the above-described third embodiment is combined with the above-described fourth embodiment, as shown in FIG. 21, it is preferable that the area of the first dummy pad 121, the area of the second dummy pad 122, and the total area of the movable electrode pad 84d, the first to fourth fixed electrode pads 85d to 88d, and the first peripheral section pad 131d, are mutually equal. Further, when the above-described third embodiment is combined with the above-described fifth embodiment, as shown in FIG. 22, it is preferable that the total area of the first dummy pad 121 and the second peripheral section pad 132, the area of the second dummy pad 122, and the total area of the movable electrode pad 84d, the first to fourth fixed electrode pads 85d to 88d, and the first peripheral section pad 131d, are mutually equal.

Figure 23:
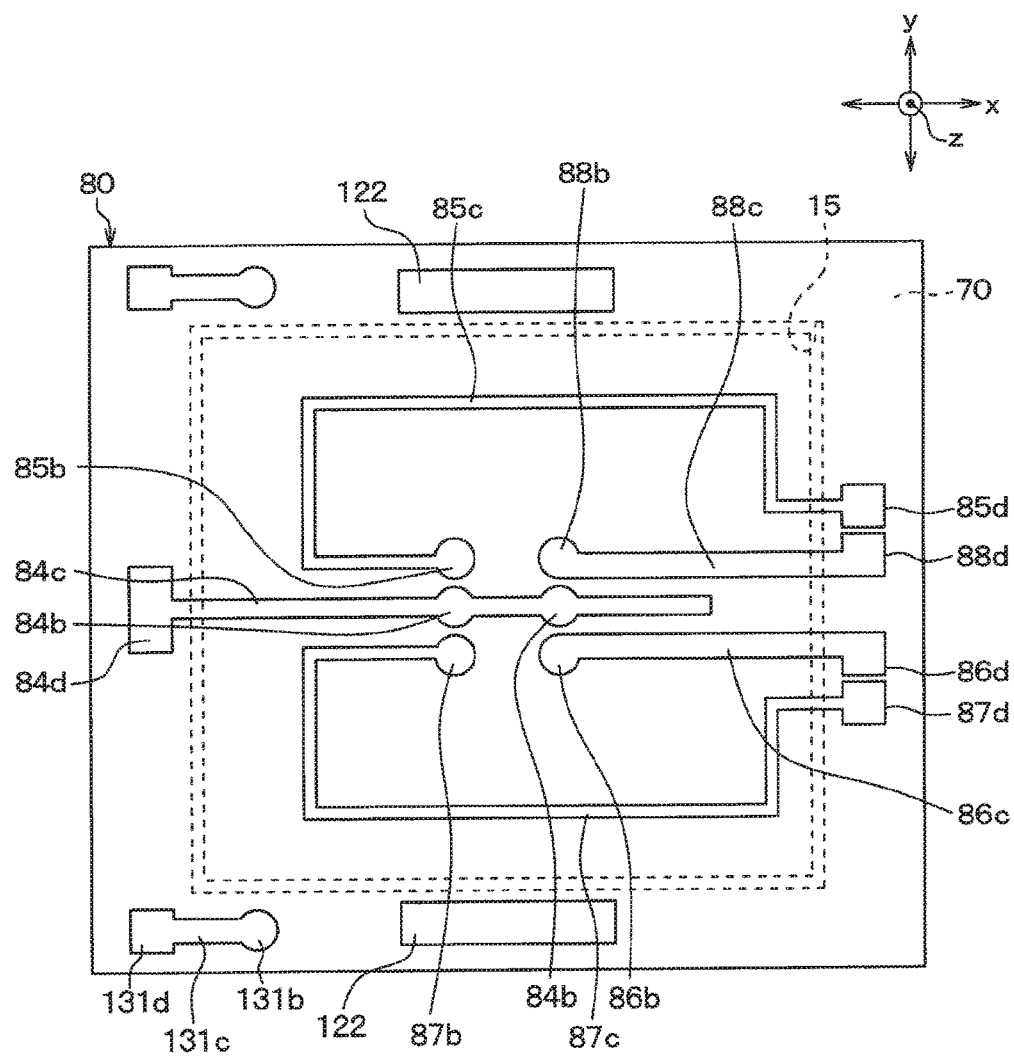
FIG. 23 is a plane schematic diagram of the cap section viewed from the stacking direction of the sensor section and the cap section, according to another embodiment of the present disclosure.
Figure 24:
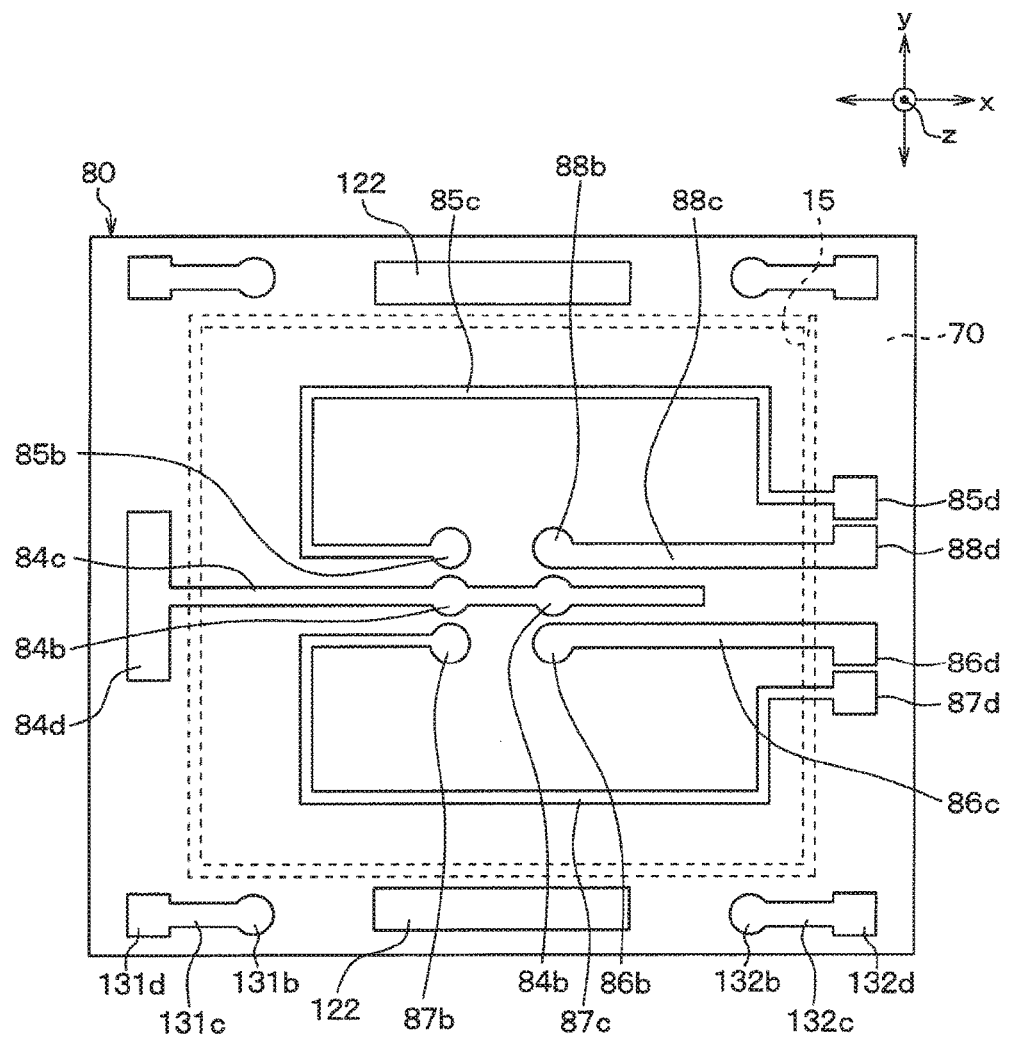
FIG. 24 is a plane schematic diagram of the cap section viewed from the stacking direction of the sensor section and the cap section, according to another embodiment of the present disclosure.

Similarly, the acceleration sensor may be a combination of the seventh embodiment, the eighth embodiment and the ninth embodiment, appropriately having the dummy pad 122, the first and second peripheral section pads 131d and 132d and the like. Note that when the above-described seventh embodiment is combined with the above-described eighth embodiment, as shown in FIG. 23, it is preferable that the area of the dummy pad 122, the total area of the movable electrode pad 84d and the first peripheral section pad 131d, and the total area of the first to fourth fixed electrode pads 85d to 88d are mutually equal. Further, when the above-described seventh embodiment is combined with the above-described ninth embodiment, as show in FIG. 24, it is preferable that the area of the dummy pad 122, the total area of the movable electrode pad 84d and the first peripheral section pad 131d, and the total area of the first to fourth fixed electrode pads 85d to 88d, and the second peripheral section pad 132d, are mutually equal.

In the acceleration sensor shown in FIGS. 19 to 24, as the areas of the respective pads are appropriately equal, it is possible to reduce the difference among the deformation amount in the parts where the respective pads are formed. Note that in FIGS. 19 to 24, the protective film 90 is omitted.

Further, the above-described seventh embodiment may be combined with the above-described the tenth embodiment. In this case, although not particularly illustrated, the dummy pad 122 is formed, in the region overlapped with the peripheral section 70 of the sensor section 10, in the cap section 80, in the region opposing the region where the movable electrode pad 84d is formed, and the region opposing the region where the first to fourth fixed electrode pads 85d to 88d are formed. Further, the above-described eighth, the ninth embodiment, and the tenth embodiment may be appropriately combined, and the sensor may have the first and second peripheral section pads 131d and 132d.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. An acceleration sensor comprising:
a sensor section having one surface;
a sensing section including a movable electrode displaceable in accordance with acceleration and a fixed electrode arranged to face the movable electrode, and outputting a sensor signal corresponding to a capacitance between the movable electrode and the fixed electrode, the movable electrode and the fixed electrode being arranged on the one surface of the sensor section and providing a comb-teeth structure; and
a peripheral section surrounding the sensing section arranged on the one surface of the sensor section, wherein:
the sensing section further includes a movable electrode connecting section connected to the movable electrode and a fixed electrode connecting section connected to the fixed electrode;
the sensor section includes a cap section having one surface and an other surface;
the one surface of the cap section is opposed to the one surface of the sensor section;
the cap section includes a movable electrode through hole and a fixed electrode through hole, each of which penetrates the cap section in a stacking direction of the cap section and the sensor section to expose the movable electrode connecting section and the fixed electrode connecting section, respectively;
the cap section further includes a movable electrode through-hole electrode electrically connected to the movable electrode connecting section and arranged in the movable electrode through hole, and a fixed electrode through-hole electrode electrically connected to the fixed electrode connecting section and arranged in the fixed electrode through hole;
the cap section further includes a movable electrode pad arranged on the other surface of the cap section, electrically connected to the movable electrode through-hole electrode via a movable electrode wiring and electrically connected to a circuit device via a circuit wire, and a fixed electrode pad arranged on the other surface of the cap section, electrically connected to the fixed electrode through-hole electrode via a fixed electrode wiring and electrically connected to the circuit device via the circuit wire;

the movable electrode pad and the fixed electrode pad are adjacent to each other in a predetermined part of a region of the other surface of the cap section, the region being overlapped with the peripheral section in the stacking direction;

the cap section further includes a first dummy pad which is disposed in an other part of the region of the other surface overlapped with the peripheral section in the stacking direction, the other part being opposite to the predetermined part, where the movable electrode pad and the fixed electrode pad are arranged, with sandwiching a region overlapped with the sensing section; and the first dummy pad is not electrically connected to the movable electrode, the fixed electrode, and the circuit device.

2. The acceleration sensor according to claim 1, wherein:
the cap section further includes a second dummy pad in each of two parts of the region of the other surface overlapped with the peripheral section viewed from the stacking direction, the two parts being different from a region where the movable electrode pad, the fixed electrode pad and the first dummy pad are disposed, and sandwiching the region overlapped with the sensing section; and each second dummy pad is not electrically connected to the movable electrode, the fixed electrode, and the circuit device.

3. The acceleration sensor according to claim 1, wherein:
each dummy pad has an area equal to a total area of the movable electrode pad and the fixed electrode pad.

4. The acceleration sensor according to claim 1, wherein:
the cap section further includes two first peripheral section through holes penetrating the cap section in the stacking direction to expose the peripheral section;

the cap section further includes a first peripheral section through-hole electrode electrically connected to the peripheral section and disposed in each of the first peripheral section through holes;

the cap section further includes two first peripheral section pads arranged on the other surface, electrically connected to the first peripheral section through-hole electrodes, respectively, and electrically connected to the circuit device via the circuit wire to maintain the peripheral section at a predetermined potential;

the two first peripheral section pads are arranged to sandwich the movable electrode pad; and a total area of the two first peripheral section pads, the movable electrode pad and the fixed electrode pad is equal to an area of each dummy pad.

5. The acceleration sensor according to claim 4, wherein:
the cap section further includes two second peripheral section through holes penetrating the cap section in the stacking direction to expose the peripheral section;

the cap section further includes a second peripheral section through-hole electrode connected to the peripheral section and disposed in each of the second peripheral section through holes;

the cap section further includes two second peripheral section pads connected to the second peripheral section through-hole electrodes disposed on the other surface of the cap section;

the two second peripheral section pads are arranged line symmetrically with the two first peripheral section pads with respect to a virtual line which passes through a center of the cap section and is parallel to a straight line connecting the two first peripheral section pads; and a total area of the two first peripheral section pads, the movable electrode pad, and the fixed electrode pad is equal to a total area of the first dummy pad and the second peripheral section pads.

6. The acceleration sensor according to claim 1, wherein:
the cap section further includes two first peripheral section through holes penetrating the cap section in the stacking direction to expose the peripheral section;

the cap section further includes a first peripheral section through-hole electrode electrically connected to the peripheral section and disposed in each of the first peripheral section through holes;

the cap section further includes two first peripheral section pads arranged on the other surface, electrically connected to the first peripheral section through-hole electrodes, respectively, and electrically connected to the circuit device via the circuit wire to maintain the peripheral section at a predetermined potential; and the two first peripheral section pads are arranged to sandwich the movable electrode pad.

7. The acceleration sensor according to claim 1, wherein:
the movable electrode wiring and the fixed electrode wiring are arranged in a region different from a region overlapped with the comb-teeth structure in the stacking direction.

8. The acceleration sensor according to claim 1, wherein:
the sensor section includes a semiconductor substrate in which a semiconductor layer is stacked on a supporting substrate;

a direction in a surface direction of the semiconductor layer is defined as a first direction, and a direction orthogonal to the first direction and parallel to the surface direction is defined as a second direction;

the sensing section further includes:
 a first direction movable electrode arranged in the semiconductor layer and extending in a direction parallel to the second direction;
 a second direction movable electrode arranged in the semiconductor layer and extending in a direction parallel to the first direction;
 a frame arranged in the semiconductor layer;
 a first beam arranged in the semiconductor layer, included in the frame, and displaceable in the second direction when acceleration including a component of the second direction is applied;
 a second beam arranged in the semiconductor layer, included in the frame, and displaceable in the first direction when the acceleration including a component of the first direction is applied;
 an anchor arranged in the semiconductor layer, supporting the frame via the second beam, and providing the movable electrode connecting section;
 a first direction fixed electrode arranged in the semiconductor layer, and arranged to be opposed to the first direction movable electrode;
 a first direction fixation supporting section arranged in the semiconductor layer, supporting the first direction fixed electrode, and providing the fixed electrode connecting section;
 a second direction fixed electrode arranged in the semiconductor layer, and arranged to be opposed to the second direction movable electrode;
 a second direction fixation supporting section arranged in the semiconductor layer, supporting the second direction fixed electrode, and providing the fixed electrode connecting section; and a bar-shaped weight arranged in the semiconductor layer, passing through a center of the frame, extending in the second direction, connected to the frame via the first beam, and including the first direction movable electrode and the second direction movable electrode; and the fixed electrode wiring includes a first direction fixed electrode wiring connected to the first direction fixed electrode and a second direction fixed electrode wiring connected to the second direction fixed electrode.

9. The acceleration sensor according to claim 8, wherein:

an area of the first direction fixed electrode wiring is equal to an area of the second direction fixed electrode wiring in the stacking direction of the cap section; and a resistance value of the first direction fixed electrode wiring is equal to a resistance value of the second direction fixed electrode wiring.

10. The acceleration sensor according to claim 8, wherein:

a length of a part where the movable electrode wiring and the first fixed electrode wiring are adjacent to each other is equal to a length of a part where the movable electrode wiring and the second fixed electrode wiring are adjacent to each other.

11. The acceleration sensor according to claim 1, wherein:

the movable electrode connecting section includes two parts which sandwich the weight;

the movable electrode pad is arranged on a straight line connecting the two parts of the movable electrode connecting section in the region of the other surface of the cap section overlapped with the peripheral section in the stacking direction; and the movable electrode wiring has a linear shape arranged between the movable electrode through-hole electrode and the movable electrode pad.

12. The acceleration sensor according to claim 1, wherein:

a gravity center of the sensing section corresponds to a gravity center of the sensor section and the cap section including the movable electrode and fixed electrode pads.

13. An acceleration sensor comprising:

a sensor section having one surface;

a sensing section including a movable electrode displaceable in accordance with acceleration and a fixed electrode arranged to face the movable electrode, and outputting a sensor signal corresponding to a capacitance between the movable electrode and the fixed electrode, the movable electrode and the fixed electrode being arranged on the one surface of the sensor section and providing a comb-teeth structure; and a peripheral section surrounding the sensing section arranged on the one surface of the sensor section, wherein:

the sensing section further includes a movable electrode connecting section connected to the movable electrode and a fixed electrode connecting section connected to the fixed electrode;

the sensor section includes a cap section having one surface and an other surface;

the one surface of the cap section is opposed to the one surface of the sensor section;

the cap section includes a movable electrode through hole and a fixed electrode through hole, each of which penetrates the cap section in a stacking direction of the cap section and the sensor section to expose the movable electrode connecting section and the fixed electrode connecting section, respectively;

the cap section further includes a movable electrode through-hole electrode electrically connected to the movable electrode connecting section and arranged in the movable electrode through hole, and a fixed electrode through-hole electrode electrically connected to the fixed electrode connecting section and arranged in the fixed electrode through hole;

the cap section further includes a movable electrode pad arranged on the other surface of the cap section, electrically connected to the movable electrode through-hole electrode via a movable electrode wiring and electrically connected to a circuit device via a circuit wire, and a fixed electrode pad arranged on the other surface of the cap section, electrically connected to the fixed electrode through-hole electrode via a fixed electrode wiring and electrically connected to an other circuit device different from the circuit device via the circuit wire;

the movable electrode pad is arranged in a predetermined part of a region of the other surface of the cap section, the region being overlapped with the peripheral section in the stacking direction;

the fixed electrode pad is arranged in an other predetermined part of the region of the other surface of the cap section, the region being overlapped with the peripheral section in the stacking direction, and the other predetermined part being different from the predetermined part where the movable electrode pad is arranged;

the cap section further includes two dummy pads which is disposed in a further other part of the region of the other surface overlapped with the peripheral section in the stacking direction, the further other part being different from the predetermined part, where the movable electrode pad is arranged, and the other predetermined part, wherein the fixed electrode pad is arranged, and each dummy pad being not electrically connected to the movable electrode, the fixed electrode, the circuit device and the other circuit device;

the movable electrode pad and the fixed electrode pad are arranged to be spaced apart from each other in the predetermined part and the other predetermined part, respectively, with sandwiching the region overlapped with the sensing section; and the two dummy pads are arranged to be spaced apart from each other in two parts, respectively, with sandwiching the region overlapped with the sensing section, each of the two parts being different from the predetermined part and the other predetermined part.

14. The acceleration sensor according to claim 13, wherein:

the fixed electrode pad is arranged in the other predetermined part opposite to the predetermined part, where the movable electrode pad is arranged, with sandwiching a region overlapped with the sensing section.

15. The acceleration sensor according to claim 14, wherein:

the cap section further includes two first peripheral section through holes penetrating the cap section in the stacking direction to expose the peripheral section;

the cap section further includes a first peripheral section through-hole electrode electrically connected to the peripheral section and disposed in each of the first peripheral section through holes;

the cap section further includes two first peripheral section pads arranged on the other surface of the cap section, electrically connected to the first peripheral section through-hole electrodes, respectively, and electrically connected to the circuit device via the circuit wire to maintain the peripheral section at a predetermined potential;

the two first peripheral section pads are arranged to sandwich the movable electrode pad; and a total area of the two first peripheral section pads and the movable electrode pad is equal to an area of the fixed electrode pad.

16. The acceleration sensor according to claim 14, wherein:

the cap section further includes two first peripheral section through holes and two second peripheral section through holes, which penetrate the cap section in the stacking direction to expose the peripheral section;

the cap section further includes a first peripheral section through-hole electrode connected to the peripheral section and disposed in each of the first peripheral section through holes;

the cap section further includes a second peripheral section through-hole electrode connected to the peripheral section and disposed in each of the second peripheral section through holes;

the cap section further includes two first peripheral section pads arranged on the other surface of the cap section, electrically connected to the first peripheral section through-hole electrodes, respectively, and electrically connected to the circuit device via the circuit wire to maintain the peripheral section at a predetermined potential;

the cap section further includes a second peripheral section pad arranged on the other surface of the cap section and connected to each of the second peripheral section through-hole electrode;

the two first peripheral section pads are arranged to sandwich the movable electrode pad;

the two second peripheral section pads are arranged line symmetrically with the two first peripheral section pads with respect to a virtual line which passes through a center of the cap section and is parallel to a straight line connecting the two first peripheral section pads, and sandwich the fixed electrode pad; and a total area of the two first peripheral section pads and the movable electrode pad is equal to a total area of the two second peripheral section pads and the fixed electrode pad.

17. The acceleration sensor according to claim 13, wherein:

the movable electrode pad has an area equal to the fixed electrode pad.

18. The acceleration sensor according to claim 13, wherein:

the movable electrode pad has an area equal to the fixed electrode pad and equal to each of the two dummy pads.

19. The acceleration sensor according to claim 13, wherein:

the cap section further includes two first peripheral section through holes penetrating the cap section in the stacking direction to expose the peripheral section;

the cap section further includes a first peripheral section through-hole electrode electrically connected to the peripheral section and disposed in each of the first peripheral section through holes;

the cap section further includes two first peripheral section pads arranged on the other surface of the cap section, electrically connected to the first peripheral section through electrodes, respectively, and electrically connected to the circuit device via the circuit wire to maintain the peripheral section at a predetermined potential;

the two first peripheral section pads are arranged to sandwich the movable electrode pad; and a total area of the two first peripheral section pads and the movable electrode pad is equal to an area of the fixed electrode pad or an area of each dummy pad.

20. The acceleration sensor according to claim 13, wherein:

the cap section further includes two first peripheral section through holes and two second peripheral section through holes, which penetrate the cap section in the stacking direction to expose the peripheral section;

the cap section further includes a first peripheral section through-hole electrode connected to the peripheral section and disposed in each of the first peripheral section through holes;

the cap section further includes a second peripheral section through-hole electrode connected to the peripheral section and disposed in each of the second peripheral section through holes;

the cap section further includes two first peripheral section pads arranged on the other surface of the cap section, electrically connected to the first peripheral section through-hole electrodes, respectively, and electrically connected to the circuit device via the circuit wire to maintain the peripheral section at a predetermined potential;

the cap section further includes a second peripheral section pad arranged on the other surface of the cap section and connected to each of the second peripheral section through-hole electrode;

the two first peripheral section pads are arranged to sandwich the movable electrode pad;

the two second peripheral section pads are arranged line symmetrically with the two first peripheral section pads with respect to a virtual line which passes through a center of the cap section and is parallel to a straight line connecting the two first peripheral section pads, and sandwich the fixed electrode pad; and a total area of the two first peripheral section pads and the movable electrode pad is equal to a total area of the two second peripheral section pads and the fixed electrode pad, and equal to an area of each dummy pad.

* * * * *